United States Patent
Hasegawa

(10) Patent No.: US 9,891,473 B2
(45) Date of Patent: Feb. 13, 2018

(54) LAMINATED FILM, ORGANIC ELECTROLUMINESCENCE DEVICE, PHOTOELECTRIC CONVERTER, AND LIQUID CRYSTAL DISPLAY

(71) Applicant: SUMITOMO CHEMICAL COMPANY, LIMITED, Chuo-ku, Tokyo (JP)

(72) Inventor: Akira Hasegawa, Tsukuba (JP)

(73) Assignee: SUMITOMO CHEMICAL COMPANY, LIMITED, Chuo-ku, Tokyo (JP)

( * ) Notice: Subject to any disclaimer, the term of this patent is extended or adjusted under 35 U.S.C. 154(b) by 0 days.

(21) Appl. No.: 14/385,818

(22) PCT Filed: Mar. 21, 2013

(86) PCT No.: PCT/JP2013/059159
§ 371 (c)(1),
(2) Date: Sep. 17, 2014

(87) PCT Pub. No.: WO2013/146964
PCT Pub. Date: Oct. 3, 2013

(65) Prior Publication Data
US 2015/0044454 A1    Feb. 12, 2015

(30) Foreign Application Priority Data

Mar. 27, 2012  (JP) ................. 2012-071617

(51) Int. Cl.
*G02F 1/1339*    (2006.01)
*H01L 31/0203*   (2014.01)
(Continued)

(52) U.S. Cl.
CPC ............ *G02F 1/1339* (2013.01); *B32B 15/08* (2013.01); *B32B 27/281* (2013.01);
(Continued)

(58) Field of Classification Search
CPC ............... C04B 35/565; H01L 31/0203; H01L 51/5253; H01L 31/02322; H01L 31/055;
(Continued)

(56) References Cited

U.S. PATENT DOCUMENTS 9,011,994 B2    4/2015  Hasegawa et al.
2004/0253451 A1* 12/2004 Kawashima ............ C23C 16/30
                                                       428/411.1
(Continued)

FOREIGN PATENT DOCUMENTS

CN    102387920 A    3/2012
JP    8-48369 A      2/1996
(Continued)

OTHER PUBLICATIONS

Machine english translation of JP2002-361774 to Komada et al. retrived from the JPO website on Sep. 30, 2015.*
(Continued)

*Primary Examiner* — Jonathan Langman
(74) *Attorney, Agent, or Firm* — Sughrue Mion, PLLC

(57) ABSTRACT

Provided is a laminate film having a substrate and at least one thin film layer which has been formed on at least one surface of the substrate, in which at least one of the thin film layer contains silicon atoms, oxygen atoms, and carbon atoms.

13 Claims, 13 Drawing Sheets

(51) Int. Cl.
| | |
|---|---|
| C04B 35/565 | (2006.01) |
| C23C 16/40 | (2006.01) |
| B32B 27/36 | (2006.01) |
| B32B 15/08 | (2006.01) |
| B32B 27/28 | (2006.01) |
| B32B 27/34 | (2006.01) |
| H01L 51/44 | (2006.01) |
| B32B 27/30 | (2006.01) |
| C23C 16/505 | (2006.01) |
| H01L 51/52 | (2006.01) |
| C23C 16/455 | (2006.01) |
| C23C 16/50 | (2006.01) |
| C23C 16/54 | (2006.01) |
| C23C 28/04 | (2006.01) |
| C23C 28/00 | (2006.01) |
| H01L 31/0232 | (2014.01) |
| H01L 31/055 | (2014.01) |
| H01L 31/049 | (2014.01) |
| C23C 16/18 | (2006.01) |
| C23C 16/30 | (2006.01) |
| B32B 27/32 | (2006.01) |

(52) U.S. Cl.
CPC .......... *B32B 27/302* (2013.01); *B32B 27/306* (2013.01); *B32B 27/325* (2013.01); *B32B 27/34* (2013.01); *B32B 27/36* (2013.01); *B32B 27/365* (2013.01); *C04B 35/565* (2013.01); *C23C 16/18* (2013.01); *C23C 16/30* (2013.01); *C23C 16/401* (2013.01); *C23C 16/45523* (2013.01); *C23C 16/50* (2013.01); *C23C 16/505* (2013.01); *C23C 16/545* (2013.01); *C23C 28/04* (2013.01); *C23C 28/42* (2013.01); *C23C 28/44* (2013.01); *H01L 31/0203* (2013.01); *H01L 31/02322* (2013.01); *H01L 31/049* (2014.12); *H01L 31/055* (2013.01); *H01L 51/448* (2013.01); *H01L 51/5237* (2013.01); *H01L 51/5253* (2013.01); *B32B 27/32* (2013.01); *B32B 2255/10* (2013.01); *B32B 2255/20* (2013.01); *B32B 2307/306* (2013.01); *B32B 2307/31* (2013.01); *B32B 2307/412* (2013.01); *B32B 2307/7242* (2013.01); *B32B 2439/40* (2013.01); *B32B 2439/60* (2013.01); *G02F 2201/501* (2013.01); *Y02E 10/52* (2013.01); *Y10T 428/265* (2015.01); *Y10T 428/31667* (2015.04)

(58) Field of Classification Search
CPC . H01L 31/049; H01L 51/448; H01L 51/5237; C23C 16/45523; C23C 16/50; C23C 28/04; C23C 28/42; C23C 28/44; C23C 16/18; C23C 16/30; C23C 16/401; C23C 16/545; C23C 16/505; G02F 1/1339; G02F 2201/501; Y10T 428/31667; Y10T 428/1064; Y10T 428/1068; Y10T 428/1317; Y10T 428/26; Y10T 428/265; Y10T 428/10; B32B 27/36; B32B 15/08; B32B 27/32; B32B 27/281; B32B 27/302; B32B 27/306; B32B 27/325; B32B 27/34; B32B 27/365; B32B 2553/00; B32B 2255/10; B32B 2255/20; B32B 2307/306; B32B 2307/31; B32B 2307/412; B32B 2307/7242; B32B 2307/732; B32B 2439/40

See application file for complete search history.

(56) References Cited

U.S. PATENT DOCUMENTS

| | | | |
|---|---|---|---|
| 2010/0092781 A1* | 4/2010 | Zambov | C23C 16/30 428/412 |
| 2010/0178490 A1 | 7/2010 | Cerny et al. | |
| 2012/0040107 A1* | 2/2012 | Hasegawa | C23C 16/401 428/1.1 |

FOREIGN PATENT DOCUMENTS

| | | | | |
|---|---|---|---|---|
| JP | 2002-361774 | * | 12/2002 | ............... B32B 9/00 |
| JP | 2004-025606 A | | 1/2004 | |
| JP | 2007-152772 A | | 6/2007 | |
| JP | 2010-522828 A | | 7/2010 | |
| JP | 2011-073430 A | | 4/2011 | |
| WO | 2012/176824 A1 | | 12/2012 | |
| WO | 2013/145943 A1 | | 10/2013 | |

OTHER PUBLICATIONS

International Search Report for PCT/JP2013/059159 dated Jun. 11, 2013.
Machine translation of JPH 08-48369A published Feb. 20, 1996.
Machine translation of JP 2007-152772A published Jun. 21, 2007.
Machine translation of JP 2004-025606A published Jan. 29, 2004.
Communication dated May 21, 2015 from the State Intellectual Property Office of the People's Republic of China in counterpart application 201380016250.8.
Communication dated May 9, 2016 issued by the Taiwanese Intellectual Property Office in counterpart application No. 102110282.
Machine translation of JP H08-048369 A, published Feb. 20, 1996.
Communication dated Jul. 26, 2016, from the Japanese Patent Office in counterpart Japanese application No. 2014-507996.

* cited by examiner

Fig. 3
(1)
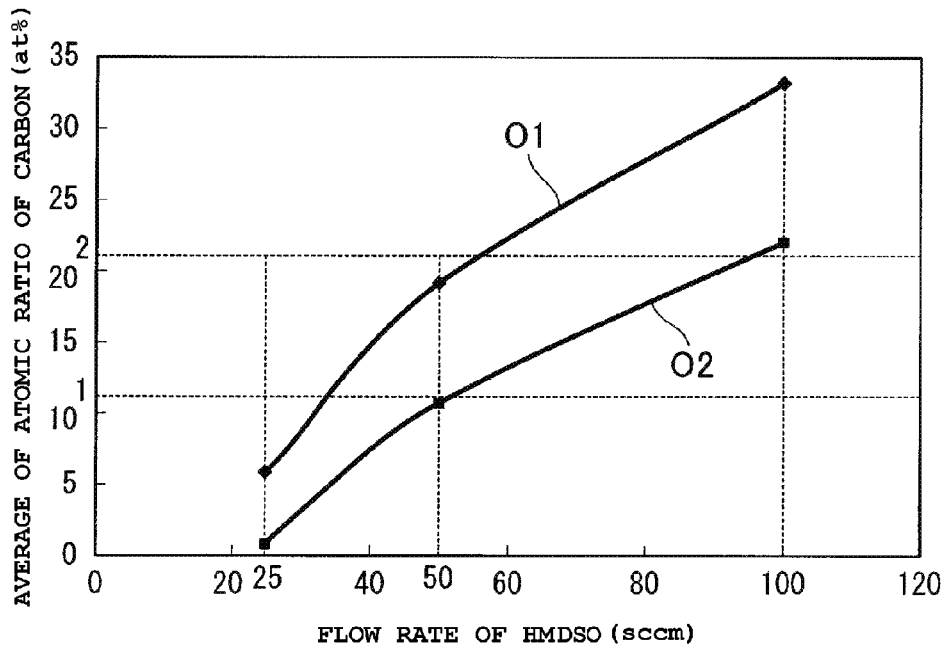
(2)
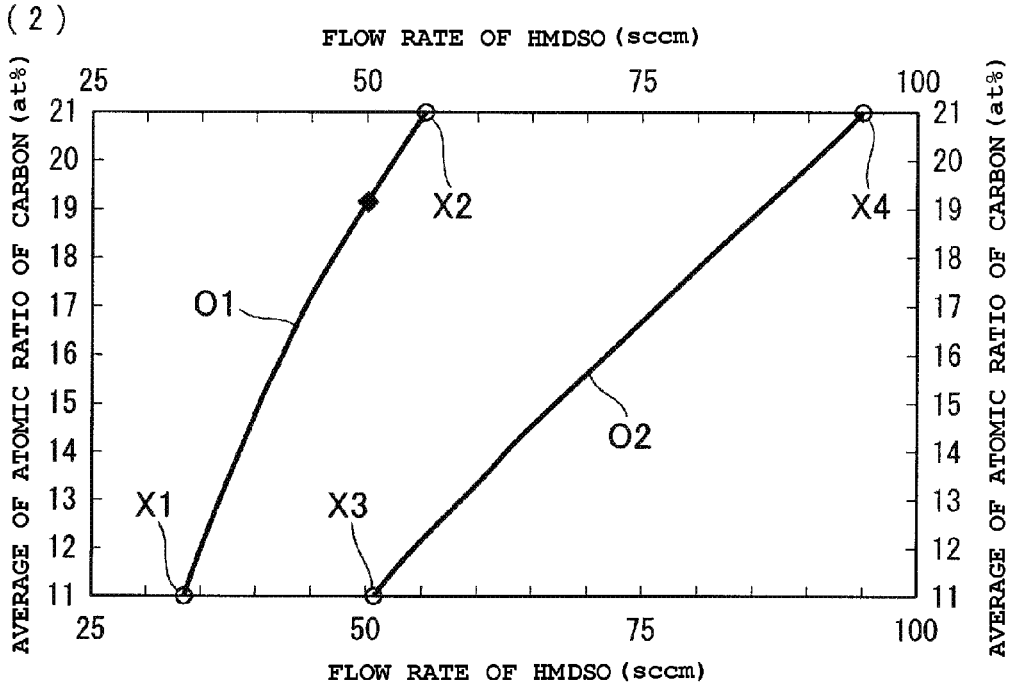

LAMINATED FILM, ORGANIC ELECTROLUMINESCENCE DEVICE, PHOTOELECTRIC CONVERTER, AND LIQUID CRYSTAL DISPLAY

CROSS REFERENCE TO RELATED APPLICATIONS

This application is a National Stage of International Application No. PCT/JP2013/059159 filed Mar. 21, 2013, claiming priority based on Japanese Patent Application No. 2012-071617 filed Mar. 27, 2012, the contents of all of which are incorporated herein by reference in their entirety.

TECHNICAL FIELD

The present invention relates to a laminate film having gas barrier properties. The present invention further relates to an organic electroluminescence device, a photoelectric conversion device, and a liquid crystal display having the laminate film.

BACKGROUND ART

A gas barrier film may be preferably used as a packing container for filling and packing articles such as drinks and foods, cosmetics, and detergents. In recent years, there has been a proposal for the use of a laminate film having gas barrier properties (hereinafter, the film will sometimes be referred to as a "laminate film") that is obtained by using a plastic film or the like as a substrate and layering a thin film, which is formed of a substance such as silicon oxide, silicon nitride, silicon oxynitride, or aluminum oxide, on one surface of the substrate.

Among known methods of forming a thin film layer of such an inorganic substance on the surface of the plastic substrate, physical vapor deposition (PVD) methods such as those for vacuum deposition, sputtering, and ion plating, and chemical vapor deposition (CVD) methods such as those for low pressure chemical vapor deposition and plasma-enhanced chemical vapor deposition are known. For example, PTL 1 describes a laminate film having a thin film layer which contains silicon, oxygen, and carbon and in which an average atomic ratio of carbon is 10.8 at % or less.

CITATION LIST

Patent Literature

JP-A-2011-73430

SUMMARY OF INVENTION

Technical Problem

Generally, when a laminate film having gas barrier properties is bent, the thin film layer providing gas barrier properties is broken, and this leads to a problem of deterioration of the gas barrier properties. Therefore, there is a demand for a laminate film that may maintain a high degree of gas barrier properties even when being bent.

The present invention has been made to address the above circumstances, and an object thereof is to provide a laminate film that may maintain a high degree of gas barrier properties even when being bent. Another object of the present invention is to provide an organic electroluminescence device, a photoelectric conversion device, and a liquid crystal display having such a laminate film.

Solution to Problem

In order to achieve the above objects, one embodiment of the present invention provides a laminate film having a substrate and at least one thin film layer which has been formed on at least one surface of the substrate, in which at least one of the thin film layer contains silicon atoms, oxygen atoms, and carbon atoms; in a silicon distribution curve, an oxygen distribution curve, and a carbon distribution curve that respectively show relationship between a depth of the thin film layer, which is measured from the surface of the thin film layer in the film thickness direction of the thin film layer, and a ratio of number of silicon atoms (atomic ratio of silicon), a ratio of number of oxygen atoms (atomic ratio of oxygen), as well as a ratio of number of carbon atoms (atomic ratio of carbon) to a total number of silicon atoms, oxygen atoms, and carbon atoms which are positioned away from the surface by the depth and contained in the thin film layer, all of the following conditions (i), (ii), and (iii) are satisfied, (i) the atomic ratio of silicon, the atomic ratio of oxygen, and the atomic ratio of carbon satisfy a condition represented by the following Formula (1) in a region that takes up for 90% or more of the thin film layer in the film thickness direction, $$\text{(Atomic ratio of oxygen)} > \text{(atomic ratio of silicon)} > \text{(atomic ratio of carbon)} \quad (1)$$

(ii) the carbon distribution curve has at least one extremal value, (iii) an absolute value of a difference between a maximum value and a minimum value of atomic ratio of carbon in the carbon distribution curve is 5 at % or greater;

an average of the atomic ratio of carbon obtained from the carbon distribution curve is from 11 at % to 21 at %; and an average density of the thin film layer is 2.0 g/cm$^3$ or higher.

In another embodiment of the present invention, the thin film layer desirably further contains hydrogen atoms, and a ratio of a value, which is obtained by summing up peak areas of $Q^1$, $Q^2$, and $Q^3$, to a peak area of $Q^4$ desirably satisfies the following condition (I), based on a silicon atom abundance ratio which is obtained by performing $^{29}$Si solid-state NMR analysis on silicon atoms of the thin film layer that bind to oxygen atoms in different states.

$$\text{(Value obtained by summing up peak areas of } Q^1, Q^2, \text{ and } Q^3\text{)/(Peak area of } Q^4\text{)} < 1.0 \quad (I)$$

($Q^1$ represents a silicon atom having bound to one neutral oxygen atom and three hydroxyl groups, $Q^2$ represents a silicon atom having bound to two neutral oxygen atoms and two hydroxyl groups, $Q^3$ represents a silicon atom having bound to three neutral oxygen atoms and one hydroxyl groups, and $Q^4$ represents a silicon atom having bound to four neutral oxygen atoms.)

In another embodiment of the present invention, an average of the atomic ratio of carbon and oxygen that is obtained from the carbon-oxygen distribution curve showing relationship between the depth and a ratio of a total number of carbon atoms and oxygen atoms (atomic ratio of carbon and oxygen) to the total number is desirably from 63.7 at % to 70.0 at %.

In another embodiment of the present invention, a position in which a value of atomic ratio of silicon is from 29 at % to 38 at % in the silicon distribution curve desirably takes up 90% or more of region of the thin film layer in the film thickness direction.

In another embodiment of the present invention, the carbon distribution curve preferably has a plurality of extremal values, and the absolute value of a difference between a maximum value and a minimum value of the extremal value is desirably 15% at or greater.

In another embodiment of the present invention, the carbon distribution curve desirably has three or more extremal values, and in the three consecutive extremal values in the carbon distribution curve, a distance between any of the extremal values adjacent to each other is desirably 200 nm or less.

In another embodiment of the present invention, the oxygen distribution curve desirably has three or more extremal values, and in the three consecutive extremal values in the oxygen distribution curve, a distance between any of the extremal values adjacent to each other is desirably 200 nm or less.

In another embodiment of the present invention, the thin film layer desirably further contains hydrogen atoms.

In another embodiment of the present invention, a film thickness of the thin film layer is desirably from 5 nm to 3,000 nm.

In another embodiment of the present invention, the substrate is desirably formed of at least one type of resin selected from the group consisting of a polyester-based resin and a polyolefin-based resin.

In another embodiment of the present invention, the polyester-based resin is desirably at least one type of resin selected from the group consisting of polyethylene terephthalate and polyethylene naphthalate.

Another embodiment of the present invention provides an organic electroluminescence device having the laminate film.

Another embodiment of the present invention provides a photoelectric conversion device having the laminate film.

Another embodiment of the present invention provides a liquid crystal display having the laminate film.

Advantageous Effects of Invention

The present invention provides a laminate film that may maintain a high degree of gas barrier properties even when being bent. It is possible to provide an organic electroluminescence device, a photoelectric conversion device, and a liquid crystal display having the laminate film.

BRIEF DESCRIPTION OF DRAWINGS

FIG. 3 is a view for illustrating a method for determining film-forming conditions at the time of producing the laminate film of the present embodiment.

DESCRIPTION OF EMBODIMENTS

[Laminate Film]

The laminate film of the present embodiment has a substrate and at least one thin film layer which has been formed on at least one surface of the substrate, in which at least one of the thin film layer contains silicon atoms, oxygen atoms, and carbon atoms; in a silicon distribution curve, an oxygen distribution curve, and a carbon distribution curve that respectively show relationship between a depth of the thin film layer, which is measured from the surface of the thin film layer in the film thickness direction of the thin film layer, and a ratio of number of silicon atoms (atomic ratio of silicon), a ratio of number of oxygen atoms (atomic ratio of oxygen), as well as a ratio of number of carbon atoms (atomic ratio of carbon) to a total number of silicon atoms, oxygen atoms, and carbon atoms which are positioned away from the surface by the depth and contained in the thin film layer, all of the following conditions (i) to (iii) are satisfied, (i) the atomic ratio of silicon, the atomic ratio of oxygen, and the atomic ratio of carbon satisfy a condition represented by the following Formula (1) in a region that takes up for 90% or more of the thin film layer in the film thickness direction, $$\text{(Atomic ratio of oxygen)} > \text{(atomic ratio of silicon)} > \text{(atomic ratio of carbon)} \tag{1}$$

(ii) the carbon distribution curve has at least one extremal value, (iii) an absolute value of a difference between a maximum value and a minimum value of atomic ratio of carbon in the carbon distribution curve is 5 at % or greater;

an average of the atomic ratio of carbon obtained from the carbon distribution curve is from 11 at % to 21 at %; and an average density of the thin film layer is 2.0 g/cm$^3$ or higher.

In the laminate film of the present embodiment, a thin film layer H may contain hydrogen atoms.

Hereinafter, the laminate film according to the present embodiment will be described with reference to drawings. In all of the following drawings, in order to make it easy to see the drawings, dimension, scale, etc. of each of the constituents have been modified as appropriate.

Figure 1:
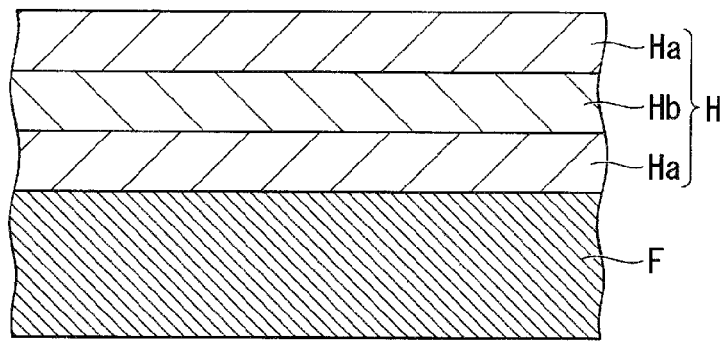
FIG. 1 is a schematic view showing the laminate film of the present embodiment.

FIG. 1 is a schematic view showing an example of the laminate film of the present embodiment. In the laminate film of the present embodiment, the thin film layer H providing gas barrier properties is layered on the surface of a substrate F. In the thin film layer H, at least one layer contains silicon, oxygen, and hydrogen. The thin film layer H has a first layer Ha, which contains a large amount of $SiO_2$ generated by a complete oxidation reaction of film-forming gas which will be described later, and a second layer Hb which contains a large amount of $SiO_xC_y$ generated by an incomplete oxidation reaction. The thin film layer H has three-layer structure in which the first layer Ha and the second layer Hb are alternately layered on each other.

The drawing schematically shows that there is distribution of film composition. However, in reality, there is no clear interface between the first layer Ha and the second layer Hb, and the composition changes continuously. The thin film layer H may use the aforementioned three-layer structure as one unit and may be formed of a plurality of the units layered on each other. A method for producing the laminate film shown in FIG. 1 will be described later in detail.

(Substrate)

The substrate F of the laminate film of the present embodiment is a flexible film formed of a polymer material.

When the laminate film of the present embodiment has light permeability, examples of the material forming the substrate F include polyester resins such as polyethylene terephthalate (PET) and polyethylene naphthalate (PEN); polyolefin resins such as polyethylene (PE), polypropylene (PP), and cyclic polyolefin; polyamide resins; polycarbonate resins; polystyrene resins; polyvinyl alcohol resins; saponified substances of ethylene-vinyl acetate copolymers; polyacrylonitrile resins; acetal resins; and polyimide resins. Among them, polyester-based resins or polyolefin-based resins are preferable, and PET or PEN as a polyester-based resin is more preferable, from the viewpoint that these exhibit strong heat resistance and have a small linear expansion coefficient. The above resins may be used individually or in combination.

Furthermore, when the light permeability of the laminate film is not considered as being important, as the substrate F, for example, composite materials obtained by adding a filler or an additive to the above resins may be used.

A thickness of the substrate F may be set in consideration of safety at the time of producing the laminate film as appropriate. However, the thickness is preferably 5 µm to 500 µm, since the substrate may be easily transported even in vacuum. When the thin film layer H used in the present embodiment is formed by a plasma enhanced chemical vapor deposition method (plasma CVD method), electric discharge is caused through the substrate F, and consequentially, the thickness of the substrate F is more preferably 50 µm to 200 µm, and particularly preferably 50 µm to 100 µm.

In addition, in order to enhance adhesiveness between the substrate F and the thin film layer to be formed, the substrate F may be subjected to surface activating treatment for cleaning the surface. Examples of the surface activating treatment include corona treatment, plasma treatment, and flame treatment.

(Thin Film Layer)

The thin film layer H of the laminate film of the present embodiment is formed on at least one surface of the substrate F, and at least one layer of the thin film layer H contains silicon, oxygen, and carbon. The thin film layer H may further contain nitrogen and aluminum. The thin film layer H may be formed on both surfaces of the substrate F.

(Density of Thin Film Layer)

The thin film layer H of the laminate film of the present embodiment has high average density which is 2.0 g/cm$^3$ or higher. In the present specification, the "average density" of the thin film layer H refers to density obtained by the method described in "(5) Measurement of average density and ratio of number of hydrogen atoms of thin film layer" which will be described later.

Since the density of the thin film layer H is 2.0 g/cm$^3$ or higher, the laminate film of the present embodiment exhibits a high degree of gas barrier properties. When the thin film layer H is formed of silicon, oxygen, carbon, and hydrogen, the average density of the thin film layer is lower than 2.22 g/cm$^3$.

(Distribution of Silicon, Carbon, and Oxygen in Thin Film Layer)

The thin film layer H of the laminate film of the present embodiment satisfies all of the aforementioned conditions (i) to (iii), in a silicon distribution curve, an oxygen distribution curve, and a carbon distribution curve that respectively show relationship between a depth of the thin film layer H, which is measured from the surface of the thin film layer H in the film thickness direction of the thin film layer H, and a ratio of number of silicon atoms (atomic ratio of silicon), a ratio of number of oxygen atoms (atomic ratio of oxygen), as well as a ratio of number of carbon atoms (atomic ratio of carbon) to a total number of silicon atoms, oxygen atoms, and carbon atoms which are positioned away from the surface by the depth and contained in the thin film layer.

Hereinafter, the distribution curve of each of each element will be described first, and then the conditions (i) to (iii) will be described.

The silicon distribution curve, the oxygen distribution curve, the carbon distribution curve, and the oxygen-carbon distribution curve which will be described later may be plotted by performing so-called XPS depth profile analysis in which sequential surface composition analysis is performed in a state where the inside of a sample is being exposed to the outside, by concurrently using X-ray Photoelectron Spectroscopy (XPS) and ion gas sputtering utilizing noble gas such as argon gas.

In the distribution curve obtained by XPS depth profile analysis, the ordinate indicates an atomic ratio (unit: at %) of an element, and the abscissa indicates an etching time. For the XPS depth profile analysis, it is preferable to use a noble gas ion sputtering utilizing argon ($Ar^+$) as an etching ion species and to set the etching speed (etching rate) to 0.05 nm/sec (expressed in terms of $SiO_2$ thermal oxide film).

The $SiO_xC_y$ contained in a large amount in the second layer is etched more rapidly than the $SiO_2$ thermal oxide film is. Accordingly, 0.05 nm/sec which is the etching speed of the $SiO_2$ thermal oxide film is used as an index of etching conditions. That is, in a strict sense, a product of 0.05 nm/sec which is the etching speed and the etching time taken for etching the film up to the substrate F does not indicate a distance between the surface of the thin film layer H and the substrate F.

Therefore, the film thickness of the thin film layer H is separately obtained by measurement, and based on the obtained film thickness and the etching time taken for etching the film up to the substrate F from the surface of the thin film layer H, the "depth of the thin film layer H that is measured from the surface of the thin film layer H in the film thickness direction of the thin film layer H" is made correspond to the etching time.

In this manner, it is possible to plot a distribution curve of each element in which the ordinate indicates an atomic ratio (unit: at %) of each element, and the abscissa indicates a depth (unit: nm) of the thin film layer H that is measured from the surface of the thin film layer H in the film thickness direction of the thin film layer H.

First, the film thickness of the thin film layer H is measured by observing a slice of thin film layer, which is prepared by a Focused Ion Beam (FIB) process, by TEM.

Thereafter, based on the obtained film thickness and the etching time taken for etching the film up to the substrate F from the surface of the thin film layer H, "depth of the thin film layer H that is measured from the surface of the thin film layer H in the film thickness direction of the thin film layer H" is made correspond to the etching time.

In the XPS depth profile analysis, when an etching region moves from the thin film layer H formed of materials such as $SiO_2$ or $SiO_xC_y$, to the substrate F formed of materials such as a polymer material, the measured atomic ratio of carbon rapidly increases. Therefore, in the present invention, the time when a slope becomes maximum in the region in which the "atomic ratio of carbon rapidly increases" in the XPS depth profile is taken as an etching time corresponding to the boundary between the thin film layer H and the substrate F in the XPS depth profile analysis.

When the XPS depth profile analysis is performed discretely with respect to the etching time, a time when the measured value of a difference in the atomic ratio of carbon between two adjacent points becomes maximum in measured time is extracted, and a midpoint between the two points is taken as the etching time corresponding to the boundary of the thin film layer H and the substrate F.

When the XPS depth profile analysis is performed continuously with respect to the film thickness direction, in the region in which the "atomic ratio of carbon rapidly increases", a point at which the value of temporal differentiation becomes maximum in a graph showing the atomic ratio of carbon relative to the etching time is taken as the etching time corresponding to the boundary between the thin film layer H and the substrate F.

That is, by making the film thickness of the thin film layer, which is obtained by observing the cross-section of a slice of thin film layer by TEM, correspond to the "etching time corresponding to the boundary between the thin film layer H and the substrate F" in the XPS depth profile, it is possible to plot a distribution curve of each element in which the ordinate indicates the atomic ratio of each element, and the abscissa indicates the depth of the thin film layer H that is measured from the surface of the thin film layer H in the film thickness direction of the thin film layer H.

The condition (i) required for the thin film layer H is that an atomic ratio of silicon, an atomic ratio of oxygen, and an atomic ratio of carbon in the thin film layer H need to satisfy the following Formula (1) in a region that takes up 90% or more of the film thickness of the layer.

$$\text{(Atomic ratio of oxygen)} > \text{(atomic ratio of silicon)} > \text{(atomic ratio of carbon)} \quad (1)$$

The thin film layer H satisfies the Formula (1) preferably in a region that takes up 95% or more of the film thickness of the thin film layer H, and particularly preferably in a region that takes up 100% of the film thickness of the thin film layer H.

When the atomic ratio of silicon, atomic ratio of oxygen, and atomic ratio of carbon in the thin film layer H satisfy the condition (i), gas barrier properties of the obtained laminate film becomes sufficient.

The condition (ii) required for the thin film layer H is that a carbon distribution curve of the thin film layer H needs to have at least one extremal value.

The carbon distribution curve of the thin film layer H preferably has at least two extremal values, and particularly preferably has at least three extremal values. If the carbon distribution curve does not have an extremal value, gas barrier properties of the obtained laminate film deteriorate and become insufficient when the film is bent.

When the carbon distribution curve has at least three extremal values, between one extremal value of the carbon distribution curve and any of other extremal values adjacent to the extremal value, the absolute value of a difference in the depth of the thin film layer H that is measured from the surface of the thin film layer H in the film thickness direction of the thin film layer H is preferably 200 nm or less, and more preferably 100 nm or less.

In the present specification, the "extremal value" refers to a maximum value or a minimum value of atomic ratio of an element with respect to the depth of the thin film layer H that is measured from the surface of the thin film layer H in the film thickness direction of the thin film layer H in the distribution curve of each element.

In the present specification, the "maximum value" refers to a point at which the value of atomic ratio of an element that has kept increasing begins decreasing when the depth of the thin film layer H that is measured from the surface of the thin film layer H changes. In addition, it also refers to a point at which the value of atomic ratio of an element, which is in a position determined when the depth of the thin film layer H that is measured from the surface of the thin film layer H in the film thickness direction of the thin film layer H changes by 20 nm from the aforementioned point, decreases 3 at % or more compared to the value of atomic ratio of the element at the aforementioned point.

Furthermore, in the present specification, the "minimum value" refers to a point at which the value of atomic ratio of an element that has kept decreasing begins increasing when the depth of the thin film layer H that is measured from the surface thereof changes. In addition, it also refers to a point at which the value of atomic ratio of an element, which is in a position determined when the depth of the thin film layer H that is measured from the surface of the thin film layer H in the film thickness direction of the thin film layer H changes by 20 nm from the aforementioned point, increases 3 at % or more compared to the value of atomic ratio of the element at the aforementioned point.

The condition (iii) required for the thin film layer H is that in the carbon distribution curve of the thin film layer H, the absolute value of a difference between the maximum value and the minimum value of the atomic ratio of carbon needs to be 5 at % or greater.

In the thin film layer H, the absolute value of a difference between the maximum value and the minimum value of the atomic ratio of carbon is more preferably 6 at % or greater, and particularly preferably 7 at % or greater. If the absolute value is less than 5 at %, the obtained laminate film is insufficient in gas barrier properties when being bent.

(Atomic Ratio of Carbon of Thin Film Layer)

Regarding the thin film layer H of the laminate film of the present embodiment, an average of the atomic ratio of carbon that is obtained from the carbon distribution curve is from 11 at % to 21 at %.

In the present specification, as the "average of the atomic ratio of carbon that is obtained from the carbon distribution curve", a value obtained by calculating an average of the atomic ratios of carbon included in a region between the following two point.

First, in the laminate film of the present embodiment, the thin film layer H has a structure consisting of layers including the first layer Ha which contains a large amount of $SiO_2$, the second layer Hb which contains a large amount of $SiO_xC_y$, and the first layer Ha, in the film thickness direction. Accordingly, in the carbon distribution curve, the minimum value of the atomic ratio of carbon corresponding to the first layer Ha is expected to be in the vicinity of the film surface and in the vicinity of the substrate F.

Consequently, when the carbon distribution curve has such a minimum value, as the aforementioned average, a value obtained by calculating an average of atomic ratios of carbon that are included in a region from a minimum value, which is closest to the uppermost surface (closest to starting point) of the thin film layer in the carbon distribution curve, to a minimum value obtained before the etching region moves to the region in which the "atomic ratio of carbon rapidly increases" in the carbon distribution curve is used.

In a laminate film which is compared to the laminate film of the present embodiment and is configured in other ways, either or both of the surface side and the substrate side do not have the aforementioned minimum value. Accordingly, when the carbon distribution curve does not have such a minimum value, a standard point for calculating the average is set at the surface side and the substrate side of the thin film layer H in the following manner.

For the surface side, in the region in which the value of atomic ratio of carbon decreases when the depth of the thin film layer H that is measured from the surface thereof changes, if the absolute value of a difference in atomic ratio of carbon between a certain point (first point) and a point (second point), which is determined when the depth of the thin film layer H that is measured from the surface of the thin film layer H in the film thickness direction of the thin film layer H changes by 20 nm from the certain point, becomes 5 at % or less, the second point is taken as a standard point.

For the substrate side, in a region which is in the vicinity of the region, which includes the boundary between the thin film layer and the substrate and in which the "atomic ratio of carbon rapidly increases", and in which the atomic ratio of carbon increases when the depth of the thin film layer H that is measured from the surface thereof changes, if the absolute value of a difference in atomic ratio of carbon between a certain point (first point) and a point (second point), which is determined when the depth of the thin film layer H that is measured from the surface of the thin film layer H in the film thickness direction of the thin film layer H changes by 20 nm from the certain point, is 5 at % or less, the first point is taken as a standard point.

When the XPS depth profile analysis for plotting the carbon distribution curve is performed discretely with respect to the film thickness direction, the "average" of atomic ratio of carbon is obtained by calculating an arithmetic mean of values measured respectively. When the XPS depth profile analysis is performed continuously with respect to the film thickness direction, the "average" is obtained by calculating a value of integral of the carbon distribution curve in the region for which the average is to be calculated, and calculating a length of one side of a rectangle which has another side as long as the length of the region and has an area corresponding to the value of integral.

If the average of atomic ratio of carbon in the thin film layer H is from 11 at % to 21 at %, the laminate film may maintain a high degree of gas barrier properties even after being bent. The average is more preferably from 11 at % to 20 at %, and even more preferably from 11 at % to 19.5 at %.

When the laminate film has transparency, the larger the difference between a refractive index of the substrate and a refractive index of the thin film layer of the laminate film is, the further the transparency may deteriorate due to reflection and scattering occurring in the interface between the substrate and the thin film layer. In this case, if the atomic ratio of carbon of the thin film layer is controlled to fall within the range of the aforementioned numerical values so as to reduce the difference in the refractive index between the substrate and the thin film layer, transparency of the laminate film may be improved.

For example, when PEN is used as a substrate, if the average of atomic ratio of carbon is from 11 at % to 21 at %, the laminate film exhibits a higher degree of light transmittance and transparency, compared to a case where the average of atomic ratio of carbon is greater than 21 at %.

In the laminate film of the present embodiment, the average of atomic ratio of carbon and oxygen that is obtained from the carbon-oxygen distribution curve is preferably from 63.7 at % to 70.0 at %.

In the present specification, as the "average of atomic ratio of carbon and oxygen", similarly to the "average of atomic ratio of carbon", a value obtained by calculating an arithmetic mean of atomic ratios of carbon and oxygen that are included in a region from a minimum value, which is closest to the uppermost surface (closest to starting point) of the thin film layer in the carbon distribution curve, to a minimum value obtained before the etching region moves to the region of the substrate in the carbon distribution curve is used.

In the laminate film of the present embodiment, in the silicon distribution curve, a position in which the atomic ratio of silicon is from 29 at % to 38 at % preferably takes up 90% or more of a region of the thin film layer in the film thickness direction. If the atomic ratio of silicon is within the above range, gas barrier properties of the obtained laminate film tend to be improved. In the silicon distribution curve, a position in which the atomic ratio of silicon is from 30 at % to 36 at % more preferably takes up 90% or more of a region of the thin film layer in the film thickness direction.

At this time, in the oxygen-carbon distribution curve that shows relationship between the depth of the thin film layer that is measured from the surface of the thin film layer in the film thickness direction of the thin film layer and a ratio of total number of oxygen atoms and carbon atoms (atomic ratio of oxygen and carbon) to a total number of silicon atoms, oxygen atoms, and carbon atoms which are positioned away from the surface by the depth, a position in which the atomic ratio of oxygen and carbon is from 62 at % to 71 at % preferably takes up 90% or more of a region of the thin film layer in the film thickness direction.

Furthermore, in the laminate film of the present embodiment, the carbon distribution curve preferably has a plurality of extremal values, and the absolute value of a difference between the maximum value of an extremal value and the minimum value of an extremal value is preferably 15% at or greater.

Regarding the laminate film of the present embodiment, the oxygen distribution curve preferably has at least one extremal value, more preferably has at least two extremal values, and particularly preferably has at least three extremal values, since gas barrier properties at the time of bending the obtained laminate film are improved.

When the oxygen distribution curve has at least three extremal values as described above, between one extremal value of the oxygen distribution curve and any of other extremal values adjacent to the extremal value, the absolute value of a difference in the depth of the thin film layer H that is measured from the surface of the thin film layer H in the film thickness direction of the thin film layer H is preferably 200 nm or less, and more preferably 100 nm or less.

In addition, regarding the laminate film of the present embodiment, the absolute value of a difference between a maximum value and a minimum value of the atomic ratio of carbon in the oxygen distribution curve of the thin film layer H is preferably 5 at % or greater, more preferably 6 at % or greater, and particularly preferably 7 at % or greater, since gas barrier properties at the time of bending the obtained laminate film are improved.

Regarding the laminate film of the present embodiment, the absolute value of a difference between a maximum value and a minimum value with respect to the atomic ratio of silicon in the silicon distribution curve of the thin film layer H is preferably less than 5 at %, more preferably less than 4 at %, and particularly preferably less than 3 at %, since gas barrier properties at the time of bending the obtained laminate film are improved.

Regarding the laminate film of the present embodiment, the absolute value of a difference between a maximum value and a minimum value with respect to the atomic ratio of oxygen and carbon in the oxygen-carbon distribution curve is preferably less than 5 at %, more preferably less than 4 at %, and particularly preferably less than 3 at %, since gas barrier properties at the time of bending the obtained laminate film are improved.

Furthermore, in the laminate film of the present embodiment, from the viewpoint of forming the thin film layer H that is uniform throughout the entire film surface and is excellent in gas barrier properties, the thin film layer H is preferably substantially uniform in the film surface direction (direction which is in parallel with the surface of the thin film layer H). In the present specification, the state in which the thin film layer H is substantially uniform in the film surface direction refers to a state in which when the oxygen distribution curve, the carbon distribution curve, and the oxygen-carbon distribution curve are plotted for any two analysis sites on the film surface of the thin film layer H by the XPS depth profile analysis, the extremal values in the carbon distribution curves obtained from any two analysis sites are the same as each other, and the absolute values of a difference between a maximum value and a minimum value of the atomic ratio of carbon in each of the carbon distribution curves are the same as each other or different from each other within 5 at %.

The carbon distribution curve of the laminate film of the present embodiment is preferably the one continuous in substance. In the present embodiment, the carbon distribution curve that is continuous in substance refers to a carbon distribution curve that does not have a part in which the atomic ratio of carbon discontinuously changes. Specifically, in such a carbon distribution curve, the relationship between a depth (x, unit: nm) of the thin film layer H that is measured from the surface thereof in the film thickness direction of the thin film layer H and an atomic ratio (C, unit: at %) of carbon satisfy a condition represented by the following Formula (F1).

$$|dC/dx| \leq 0.5 \tag{F1}$$

(Peak Area in $^{29}$Si-Solid-State NMR)

At least one layer of the thin film layer H of the laminate film of the present embodiment preferably contains silicon, oxygen, and hydrogen. In addition, a ratio of a value obtained by summing up peak areas of $Q^1$, $Q^2$, and $Q^3$ to a peak area of $Q^4$ that is obtained by performing $^{29}$Si-solid-state NMR analysis on the thin film layer H preferably satisfies a condition represented by the following Formula (I).

$$\text{(Value obtained by summing up peak areas of } Q^1, Q^2, \text{ and } Q^3)/(\text{peak area of } Q^4) < 1.0 \tag{I}$$

$Q^1$, $Q^2$, $Q^3$, and $Q^4$ show silicon atoms constituting the thin film layer H, by differentiating the silicon atoms from one another according to the properties of oxygen binding to the silicon atoms. That is, each of the signs $Q^1$, $Q^2$, $Q^3$, and $Q^4$ shows a fact that when an oxygen atom forming a Si—O—Si bond is read to mean a "neutral" oxygen atom relative to a hydrogen group, the oxygen atom binding to the silicon atom is as follows.

$Q^1$: a silicon atom having bound to one neutral oxygen atom and three hydroxyl groups $Q^2$: a silicon atom having bound to two neutral oxygen atoms and two hydroxyl groups $Q^3$: a silicon atom having bound to three neutral oxygen atoms and one hydroxyl group $Q^4$: a silicon atom having bound four neutral oxygen atoms When the "$^{29}$Si-solid-state NMR on the thin film layer H" is analyzed, a test specimen used for the analysis may include the substrate F.

The peak area of solid-state NMR may be calculated in the following manner for example.

First, a spectrum obtained by the $^{29}$Si-solid-state NMR analysis is subjected to a smoothing processing. Specifically, the spectrum obtained by the $^{29}$Si-solid-state NMR analysis is subjected to Fourier transform, a high frequency of equal to or higher than 100 Hz is removed, and then inverse Fourier transform is conducted, thereby performing the smoothing processing (low-pass filter processing). The spectrum obtained by the $^{29}$Si-solid-state NMR analysis has noise of the frequency higher than that of peak signals. However, the noise is removed by the smoothing by the low-pass filter processing.

In the following description, the spectrum having undergone smoothing will be referred to as an "analysis spectrum".

Next, the analysis spectrum is divided according to each peak of $Q^1$, $Q^2$, $Q^3$, and $Q^4$. That is, on the assumption that the peak of $Q^1$, $Q^2$, $Q^3$, and $Q^4$ may respectively exhibit a Gaussian distribution curve (normal distribution curve) based on chemical shift of their own, parameters such as a height of peak, full with at half maximum, etc. are optimized such that a model spectrum obtained by summing up $Q^1$, $Q^2$, $Q^3$, and $Q^4$ matches with the analysis spectrum having undergone smoothing.

The parameters are optimized by iteration. That is, by using iteration, parameters that make the sum of the square of a deviation between the model spectrum and the analysis spectrum converge to a minimum value are calculated.

Thereafter, by integrating each of the peaks of $Q^1$, $Q^2$, $Q^3$, and $Q^4$ obtained as above, each peak area is calculated. By using the peak area obtained in this manner, the (value obtained by summing up peak areas of $Q^1$, $Q^2$, and $Q^3$)/(peak area of $Q^4$), which is the left-hand member of the Formula (I), is calculated and used as an evaluation index for gas barrier properties.

In the laminate film of the present embodiment, half or more of the silicon atoms constituting the thin film layer H that are quantitated by the solid-state NMR analysis is preferably the silicon atom of $Q^4$.

The silicon atom of $Q^4$ has a network structure in which the silicon atom is surrounded by four neutral oxygen atoms, and the four neutral oxygen atoms bind to a silicon atom. On the contrary, the silicon atoms of $Q^1$, $Q^2$, or $Q^3$ binds to one or more hydroxyl groups, and consequentially, between the silicon atoms adjacent to each other, there is a minute void in which a covalent bond is not formed. Therefore, since the more the silicon atom of $Q^4$, the denser the thin film layer H, it is possible to obtain a laminate film having a high degree of gas barrier properties.

Regarding the laminate film of the present embodiment, the value of (value obtained by summing up peak areas of $Q^1$, $Q^2$, and $Q^3$)/(peak area of $Q^4$) is preferably less than 1.0 as shown in the Formula (I), since such a laminate film exhibits a high degree of gas barrier properties.

The value of (value obtained by summing up peak areas of $Q^1$, $Q^2$, and $Q^3$)/(peak area of $Q^4$) is more preferably 0.8 or less, and even more preferably 0.6 or less.

When a material containing a silicone resin or glass is used as the substrate F, in order to avoid the influence of silicon contained in the substrate during the solid-state NMR analysis, it is preferable to separate the thin film layer H from the substrate F and perform the solid-state NMR analysis only on the silicon contained in the thin film layer H.

Examples of methods for separating the thin film layer H from the substrate F include a method of scraping off the thin film layer H by using a metal spatula or the like and collecting the thin film layer H into a sample tube used for the solid-state NMR analysis. The substrate F may be removed using a solvent that dissolves only the substrate, and the thin film layer H remaining as a residue may be collected.

In the laminate film of the present embodiment, a film thickness of the thin film layer H is preferably within a range from 5 nm to 3,000 nm, more preferably within a range from 10 nm to 2,000 nm, and particularly preferably within a range from 100 nm to 1,000 nm. When the film thickness of the thin film layer H is 5 nm or greater, gas barrier properties such as oxygen gas barrier properties and water vapor barrier properties are further improved. Furthermore, when the film thickness is 3,000 nm or less, deterioration of gas barrier properties caused when the film is bent is inhibited more effectively.

The laminate film of the present embodiment (a) contains silicon atoms, oxygen atoms, and carbon atoms, (b) has an average density of 2.0 g/cm³ or higher, (c) satisfies all of the conditions (i) to (iii), and (d) has at least one thin film layer H in which the average of an atomic ratio of carbon that is obtained from a carbon distribution curve is from 11 at % to 21 at %. However, the laminate film may have two or more thin film layers that satisfy all of the conditions (a) to (d). Furthermore, when the laminate film has two or more thin film layers H described above, the materials of the plurality of thin film layers H may be the same as or different from each other. In addition, when the laminate film has two or more thin film layers H described above, the thin film layers H may be formed on either or both of the surfaces of the substrate F. The plurality of thin film layers H may include a thin film layer H that does not necessarily exhibit gas barrier properties.

When the laminate film of the present embodiment has a layer formed of two or more thin film layers H layered on each other, the value of a total film thickness of the thin film layers H (film thickness of a barrier film obtained by layering the thin film layers H on each other) is preferably greater than 100 nm but equal to or less than 3,000 nm. If the value of a total film thickness of the thin film layers H is 100 nm or greater, gas barrier properties such as oxygen gas barrier properties and vapor barrier properties are further improved. When the value of a total film thickness of the thin film layers H is 3,000 nm or less, deterioration of gas barrier properties caused when the film is bent is inhibited more effectively. The film thickness of each of the thin film layers H is preferably greater than 50 nm.

(Other Constitutions)

The laminate film of the present embodiment has the substrate F and the thin film layer H. However, the laminate film may further have a primer coating layer, a heat-sealable resin layer, an adhesive layer, etc., as necessary. The primer coating layer may be formed of a known primer coating agent which may enhance adhesiveness between the laminate film and another layer. The heat-sealable resin layer may be formed of a known heat-sealable resin as appropriate. Furthermore, the adhesive layer may be formed of a known adhesive as appropriate, and a plurality of laminate films may be bonded to each other by the adhesive layer.

The laminate film of the present embodiment has the constitution described above.

(Method for Producing Laminate Film)

Next, a method for producing the laminate film having the thin film layer which satisfies all of the aforementioned conditions (a) to (d) will be described.

Figure 2:
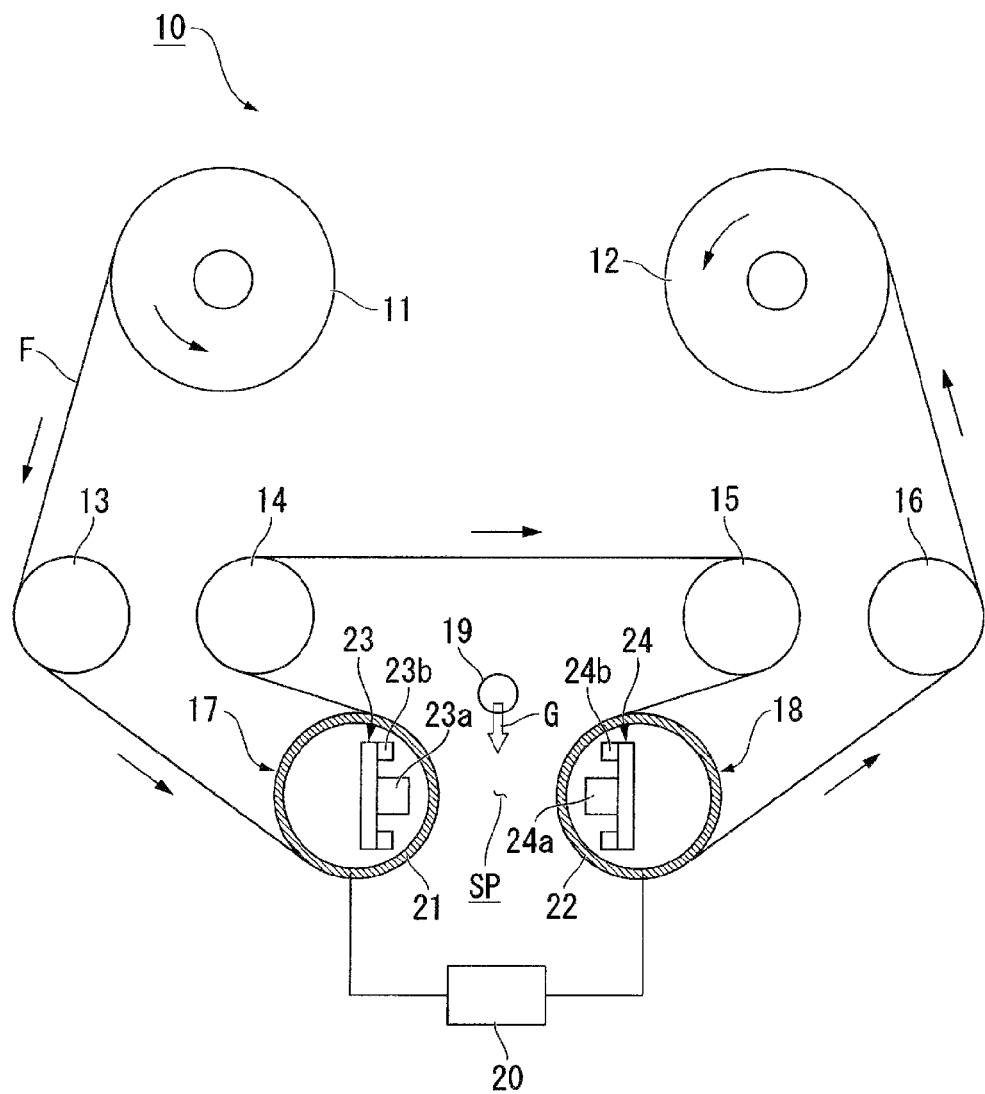
FIG. 2 is a schematic view showing an example of a manufacturing apparatus used for producing the laminate film.

FIG. 2 is a view showing an example of an apparatus for producing the laminate film according to the present embodiment, and is a schematic view of an apparatus forming the thin film layer by a plasma enhanced chemical vapor deposition method. In the drawing, in order to make it easy to see the drawing, dimension, scale, etc. of each of the constituents have been modified as appropriate.

A production apparatus 10 shown in the drawing has a feeding roll 11, a winding-up roll 12, transport rolls 13 to 16, a first film-forming roll 17, a second film-forming roll 18, a gas feed pipe 19, a power source for plasma generation 20, an electrode 21, an electrode 22, and a magnetic field-forming device 23 which is disposed inside the first film-forming roll 17, and a magnetic field-forming device 24 which is disposed inside the second film-forming roll 18.

During the production process of the laminate film, among the constituents of the production apparatus 10, the first film-forming roll 17, the second film-forming roll 18, the gas feed pipe 19, the magnetic field-forming device 23, and the magnetic field-forming device 24 are disposed inside a vacuum chamber not shown in the drawing. The vacuum chamber is connected to a vacuum pump not shown in the drawing. The internal pressure of the vacuum chamber is controlled by the operation of the vacuum pump.

If such an apparatus is used, by controlling the power source for plasma generation 20, it is possible to generate electric discharge plasma of film-forming gas supplied from the gas feed pipe 19, in a space between the first film-forming roll 17 and the second film-forming roll 18. It is also possible to form a film by plasma CVD by a continuous film-forming process by using the generated electric discharge plasma.

The substrate F which has not been subjected to film formation is wound up around the feeding roll 11. The feeding roll 11 feeds the substrate F into the apparatus by winding off the substrate in a lengthwise direction. The winding-up roll 12 is disposed at the end of the substrate F. The winding-up roll 12 winds up the substrate F which has undergone film formation while drawing the substrate, and the substrate is wound up around the roll in the form of a roll.

The first film-forming roll 17 and the second film-forming roll 18 are arranged in parallel with each other and face each other. Both the rolls are formed of a conductive material, and transport the substrate F by rotating respectively. The first film-forming roll 17 and the second film-forming roll 18 are preferably to have the same diameter. For example, the diameter is preferably from 5 cm to 100 cm.

The first film-forming roll 17 and the second film-forming roll 18 are insulated from each other and connected to the same power source for plasma generation 20. When alternating voltage is applied from the power source for plasma generation 20, an electric field is formed in a space SP between the first film-forming roll 17 and the second film-forming roll 18. The power source for plasma generation 20 is preferably to be able to apply power of 100 W to 10 kW and to control a frequency of an alternating current to be 50 Hz to 500 kHz.

The magnetic field-forming device 23 and the magnetic field-forming device 24 are members that form a magnetic field in the space SP, and contains the first film-forming roll 17 and the second film-forming roll 18 inside thereof. The magnetic field-forming device 23 and the magnetic field-forming device 24 are fixed such that the first film-forming roll 17 and the second film-forming roll 18 do not rotate at the same time (that is, they are fixed such that the posture thereof relative to the vacuum chamber do not change).

The magnetic field-forming device 23 and the magnetic field-forming device 24 have central magnets 23a and 24a which are arranged in the same direction as the first film-forming roll 17 and the second film-forming roll 18 are, and annular external magnets 23b and 24b which surround the central magnets 23a and 24a and are arranged in the same direction as the first film-forming roll 17 and the second film-forming roll 18 are. In the magnetic field-forming device 23, a magnetic line (magnetic field) connecting the central magnet 23a to the external magnet 23b forms an endless tunnel. Likewise, in the magnetic field-forming device 24, a magnetic line connecting the central magnet 24a to the external magnet 24b forms an endless tunnel.

By magnetron electric discharge caused when the magnetic line intersects with the electric field formed between the first film-forming roll 17 and the second film-forming roll 18, the electric discharge plasma of the film-forming gas is generated. The electric discharge plasma of the film-forming gas is generated. That is, the space SP, which will be described later in detail, is used as a film-forming space for forming a film by plasma CVD, and onto the surface (film forming surface) of the substrate F that does not come into contact with the first film-forming roll 17 and the second film-forming roll 18, the film-forming gas having been in the state of plasma is deposited, whereby the thin film layer is formed.

In the vicinity of the space SP, the gas feed pipe 19 which supplies film-forming gas G such as raw material gas for plasma CVD to the space SP is disposed. The gas feed pipe 19 is in the form of a pipe which extends in the same direction as the first film-forming roll 17 and the second film-forming roll 18 do, and supplies the film-forming gas G to the space SP from openings placed at a plurality of sites of the pipe. In FIG. 2, a state where the film-forming gas G is supplied to the space SP from the gas feed pipe 19 is described by arrows.

The raw material gas may be selected and used according to the material of the barrier film to be formed as appropriate. As the raw material gas, for example, organic silicon compounds containing silicon may be used. Examples of the organic silicon compounds include hexamethyldisiloxane, 1,1,3,3-tetramethyldisiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane, octamethylcyclotetrasiloxane, dimethyldisilazane, trimethyldisilazane, tetramethyldisilazane, pentamethyldisilazane, and hexamethyldisilazane. Among these organic silicon compounds, hexamethyldisiloxane and 1,1,3,3-tetrametylsiloxane are preferable since these compounds are superior in ease of handling and gas barrier properties of the obtained gas barrier film. The above organic silicon compounds may be used individually or in combination. Furthermore, in addition to the organic silicon compound, monosilane may be added as the raw material gas to the feed gas, and the thus obtained gas may be used as a silicon source of a barrier film to be formed.

As the film-forming gas, reactant gas may be used in addition to the raw material gas. As the reactant gas, gas which reacts with the raw material gas and turns into an inorganic compound such as an oxide or a nitride may be selected and used as appropriate. As the reactant gas for forming an oxide, for example, oxygen and ozone may be used. As of the reactant gas for forming a nitride, for example, nitrogen and ammonia may be used. The above reactant gas may be used individually or in combination. For example, when an oxynitrides are to be formed, the reactant gas for forming an oxide and the reactant gas for forming a nitride may be used in combination.

The film-forming gas may contain carrier gas such that the raw material gas is supplied into the vacuum chamber as necessary. As the film-forming gas, gas for electric discharge may be used such that electric discharge plasma is generated as necessary. As the carrier gas and gas for electric discharge, known gas may be used as appropriate. For example, it is possible to use noble gas such as helium gas, argon gas, neon gas, and xenon gas; and hydrogen.

The internal pressure (degree of vacuum) of the vacuum chamber may be controlled according to the type of raw material gas etc. as appropriate. However, the pressure of the space SP is preferably 0.1 Pa to 50 Pa. When a low-pressure plasma CVD method is used for plasma CVD so as to inhibit a gas-phase reaction, the pressure is generally 0.1 Pa to 10 Pa. The power of an electrode drum of the plasma-generating device may be controlled according to the type of raw material gas, the internal pressure of the vacuum chamber, etc., as appropriate, but the power is preferably 0.1 kW to 10 kW.

The transport speed (line speed) of the substrate F may be controlled according to the type of raw material gas, the internal pressure of the vacuum chamber, etc., as appropriate. However, the line speed is preferably 0.1 m/min to 100 m/min, and more preferably 0.5 m/min to 20 m/min. If the line speed is less than the lower limit, the substrate F tends to be easily wrinkled due to heat. On the contrary, if the line speed is higher than the upper limit, the film thickness of the barrier film to be formed tends to become thin.

In the aforementioned production apparatus 10, a film is formed on the substrate F in the following manner.

First, it is preferable to perform pre-treatment before forming a film such that the amount of outgas generated from the substrate F is reduced to a sufficient degree. The amount of outgas generated from the substrate F may be measured by mounting the substrate F on the production apparatus and measuring the pressure obtained when the internal pressure of the apparatus (internal pressure of the chamber) is reduced. For example, when the internal pressure of the chamber of the production apparatus is $1\times10^{-3}$ Pa or less, it is possible to make a decision that the amount of outgas generated from the substrate F has been reduced to a sufficient degree.

Examples of the method for reducing the amount of outgas generated from the substrate F include vacuum drying, heat drying, drying performing using a combination of these methods, and a drying method utilizing natural drying. Even if any of these methods is used, in order to accelerate drying of inside of the substrate F wound up in the form of a roll, it is preferable to repeat rewinding (winding off and winding up) of the roll in the process of drying such that the entire substrate F is exposed to a dry atmosphere.

The vacuum drying is performed by putting the substrate F into a pressure-resistant vacuum container and making a vacuum state by evacuating the vacuum container by using a depressurizer such as a vacuum pump. The internal pressure of the vacuum container at the time of vacuum drying is preferably 1,000 Pa or less, more preferably 100 Pa or less, and even more preferably 10 Pa or less. The evacuation of the vacuum container may be continuously performed by continuously operating the depressurizer. Alternatively, the evacuation may be intermittently performed by intermittently operating the depressurizer in a state where the internal pressure is being controlled not to be a value equal to or higher than a certain level. The drying time is preferably for 8 hours or longer, more preferably for 1 week or longer, and even more preferably for 1 month or longer.

The heat drying is performed by exposing the substrate F to an atmosphere of a temperature of 50° C. or higher. The heating temperature is preferably from 50° C. to 200° C., and more preferably from 70° C. to 150° C. If the heating temperature exceeds 200° C., the substrate F may be deformed. Furthermore, oligomer components may be eluted from the substrate F and precipitated on the surface thereof, and accordingly, defects may be formed. The drying time may be set according to the heating temperature or heating means to be used as appropriate.

The heating means is not particularly limited as long as it may heat the substrate F to a temperature from 50° C. to 200° C. at a normal pressure. Generally, among known devices, an infrared heating device, a microwave heating device, or a heating drum is preferably used.

The infrared heating device is a device that heats a subject by emitting infrared from infrared-generating means.

The microwave heating device is a device that heats a subject by emitting microwaves from microwave-generating means.

The heating drum is a device that performs heating by heating the drum surface and bringing a subject into contact with the drum surface so as to heat the subject from the contact part by heat conduction.

The natural drying is performed by placing the substrate F in an atmosphere of low humidity and maintaining the atmosphere of low humidity by supplying dry gas (dry air or dry nitrogen) to the atmosphere. For performing the natural drying, the substrate F is preferably to be placed in the low-humidity atmosphere, together with a desiccant such as silica gel. The drying time is preferably 8 hours or longer, more preferably 1 week or longer, and even more preferably 1 month or longer.

The above drying methods may be performed separately before the substrate F is mounted on the production apparatus, or may be performed inside the production apparatus before the substrate F is mounted on the production apparatus.

Examples of the drying method performed after the substrate F is mounted on the production apparatus include a method of reducing the internal pressure of the chamber in a state where the substrate F is being fed and transported from the feeding roll. In the method, the roll that the substrate passes through may have a heater, and the roll may be heated, such that the roll is used as the aforementioned heating drum for heating.

Examples of the method of reducing outgas generated from the substrate F also include a method of forming an inorganic film in advance on the surface of the substrate F. Examples of the inorganic film-forming method include physical film-forming methods such as vacuum deposition (heating deposition), electron beam (EB) deposition, sputtering, and ion plating. The inorganic film may be formed by chemical deposition methods such as thermal CVD, plasma CVD, and atmospheric pressure CVD. In addition, the influence of outgas may be further reduced by performing drying treatment on the substrate F, which has the inorganic film formed on the surface thereof, by the aforementioned drying methods.

Thereafter, the internal environment of the vacuum chamber not shown in the drawing is formed into an environment with reduced pressure, and by the application of power to the first film-forming roll 17 and the second film-forming roll 18, an electric field is formed in the space SP.

At this time, in the magnetic field-forming device 23 and the magnetic field-forming device 24, the aforementioned magnetic field in the form of an endless tunnel is formed. Accordingly, when the film-forming gas is provided, due to electrons released into the magnetic field and the space SP, electric discharge plasma of the film-forming gas in the form of a donut is formed along the tunnel. Since the electric discharge plasma may be generated by low power of around several Pa, the internal temperature of the vacuum chamber may be approximated to room temperature.

Meanwhile, the temperature of electrons trapped at a high density in the magnetic field formed by the magnetic field-forming device 23 and the magnetic field-forming device 24 is high. Consequentially, when the electrons collide with the film-forming gas, electric discharge plasma is generated. That is, due to the magnetic field and electric field formed in the space SP, the electrons are trapped in the space SP, and accordingly, electric discharge plasma of high density is formed in the space SP. Specifically, in a space overlapped with the magnetic field in the form of an endless tunnel, electric discharge plasma of high density (high intensity) is formed, and in a space not overlapped with the magnetic field in the form of an endless tunnel, electric discharge plasma of low density (low intensity) is formed. The intensity of these electric discharge plasmas continuously changes.

When the electric discharge plasma is generated, a large amount of radicals or ions are generated. Therefore, a plasma reaction is caused, and a reaction occurs between the raw material gas and the reactant gas contained in the film-forming gas. For example, an organic silicon compound as the raw material gas reacts with oxygen as the reactant gas, and as a result, an oxidation reaction of the organic silicon compound occurs. At this time, in the space in which the electric discharge plasma of high intensity is formed, strong energy is applied to the oxidation reaction. Therefore, the reaction occurs easily, and mainly a complete oxidation reaction of the organic silicon compound may occur. On the contrary, in the space in which the electric discharge plasma of low intensity is formed, weak energy is applied to the oxidation reaction. Therefore, the reaction does not proceed easily, and mainly an incomplete oxidation reaction of the organic silicon compound may occur.

In the present specification, the "complete oxidation reaction of the organic silicon compound" refers to a process in which a reaction occurs between the organic silicon compound and oxygen, and the organic silicon compound is oxidized and degraded into silicon dioxide ($SiO_2$), water, and carbon dioxide.

For example, when the film-forming gas contains hexamethyldisiloxane (HMDSO: $(CH_3)_6Si_2O$) as raw material gas and oxygen ($O_2$) as reactant gas, as the "complete oxidation reaction", a reaction descried in the following Reaction Formula (1) occurs, and silicon dioxide is produced.

[Chem. 1]

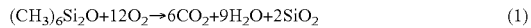

$$(CH_3)_6Si_2O+12O_2 \rightarrow 6CO_2+9H_2O+2SiO_2 \tag{1}$$

In the present specification, the "incomplete oxidation reaction of the organic silicon compound" refers to a process in which instead of the complete oxidation reaction of the organic silicon compound, a reaction that generates not $SiO_2$ but $SiO_xC_y$ ($0<x<2$, $0<y<2$) containing carbon in the structure thereof occurs.

As described above, in the production apparatus 10, the electric discharge plasma in the form of a donut is formed on the surface of the first film-forming roll 17 and the second film-forming roll 18. Accordingly, the substrate F transported onto the surface of the first film-forming roll 17 and the second film-forming roll 18 alternately passes through the space in which the high-intensity electric discharge plasma is formed and the space in which the low-intensity electric discharge plasma is formed. Consequentially, on the surface of the substrate F that passes through the surface of the first film-forming roll 17 and the second film-forming roll 18, the layer (the second layer Hb of FIG. 1) which contains a large amount of $SiO_xC_y$ generated by the incomplete oxidation reaction is formed in a state of being interposed between layers (the first layers Ha of FIG. 1) which contains a large amount of $SiO_2$ generated by the complete oxidation reaction.

Secondary electrons of a high temperature are prevented from flowing into the substrate F due to the action of the magnetic field. Accordingly, it is possible to apply strong power while keeping the temperature of the substrate F low, and a film may be formed at a high speed. A film is mainly deposited only onto the film forming surface of the substrate F, and the film-forming rolls are not easily contaminated since they are covered with the substrate F. Therefore, a film may be stably formed for a long time.

Next, a method of controlling the average of atomic ratio of carbon in the thin film layer will be described.

Regarding the thin film layer formed using the aforementioned apparatus, in order to control the average of atomic ratio of carbon contained in the thin film layer to be from 11 at % to 21 at %, for example, a film is formed using film-forming gas obtained by mixing the raw material gas with the reactant gas within a range that is determined in the following manner.

FIG. 3 is a graph showing the average of atomic ratio of carbon contained in the thin film layer to the amount of raw material gas. In the graph, the ordinate indicates the amount of raw material gas (Standard Cubic Centimeter per Minute: sccm), and the abscissa indicates the average (unit at %) of atomic ratio of carbon. The graph shows the relationship established when HMDSO is used as the raw material gas, and oxygen is used as the reactant gas.

FIG. 3 shows a graph (indicated by a sign O1) showing the relationship between the amount of HMDSO and the average of atomic ratio carbon that is established when the amount of oxygen is fixed to 250 sccm, and a graph (indicated by a sign O2) showing the relationship between the amount of HMDSO and the average of atomic ratio of carbon that is established when the amount of oxygen is fixed to 500 sccm. The graph of FIG. 3 is obtained by conducting plotting by measuring the average of atomic ratio of carbon for three points which are determined when the amount of HMDSO is varied relative to the amount of oxygen, and then performing curvilinear regression for each of the points by using a spline curve.

In addition, film-forming conditions except for the amount of oxygen and HMDSO are as follows.

(Film-Forming Conditions)

Degree of vacuum of inside of vacuum chamber: 3 Pa

Power applied from power source for plasma generation: 0.8 kW

Frequency of power source for plasma generation: 70 kHz

Transport speed of film: 0.5 m/min

The graph of FIG. 3(1) shows the following qualitative facts.

First, when the flow rate of oxygen is constant, if the flow rate of HMDSO is increased, the average of atomic ratio of carbon in the thin film layer increases. The reason may be explained as follows. That is, since the amount of HMDSO increases relative to the amount of oxygen, the reaction conditions that cause HMDSO to undergo incomplete oxidation are created, and accordingly, the amount of carbon contained in the thin film layer increases.

When the flow rate of HMDSO is constant, if the flow rate of oxygen is increased, the average of atomic ratio of carbon in the thin film layer decreases. The reason may be explained as follows. That is, since the amount of HMDSO decreases relative to the amount of oxygen, the reaction conditions become close to conditions that cause HMDSO to undergo complete oxidation, and accordingly, the amount of carbon contained in the thin film layer decreases.

Furthermore, although the ratio between HMDSO and oxygen is the same, if a total amount of the film-forming gas is large, the average of atomic ratio of carbon in the thin film layer increases. The reason may be explained as follows. That is, when the flow rate of whole film-forming gas is high, the energy that HMDSO obtains from the electric discharge plasma relatively decreases. Therefore, reaction conditions that cause HMDSO to undergo incomplete oxidation are created, and as a result, the amount of carbon contained in the thin film layer increases.

FIG. 3(2) is a partially enlarged view of the graph shown in FIG. 3(1), and is a graph obtained when the ordinate is set to indicate a range of 11 at % to 21 at %. From the coordinate of a contact point X1 between the graph O1 and the lower abscissa in FIG. 3(2), it is understood under the condition in which the flow rate of oxygen is 250 sccm, the flow rate of HMDSO that is set when the average of atomic ratio of carbon is 11 at % is about 33 sccm. From a contact point X2 between the graph O1 and the upper abscissa, it is understood that under the condition in which the flow rate of oxygen is 250 sccm, the flow rate of HMDSO that is set when the average of atomic ratio of carbon is 21 at % is about 55 sccm. That is, it is understood that under the condition in which the flow rate of oxygen is 250 sccm, if the flow rate of HMDSO is about 33 sccm to about 55 sccm, the average of atomic ratio of carbon may be controlled within a range from 11 at % to 21 at %.

Likewise, from the coordinates of contact points X3 and X4 between the graph O2 and the upper and lower abscissas, it is understood that the upper and lower limits of the flow rate of HMDSO, which are values for controlling the average of atomic ratio of carbon within a range from 11 at % to 21 at % under the condition in which the flow rate of oxygen is 500 sccm, may be read, and the lower and upper limits are about 51 sccm and about 95 sccm respectively.

Figure 4:
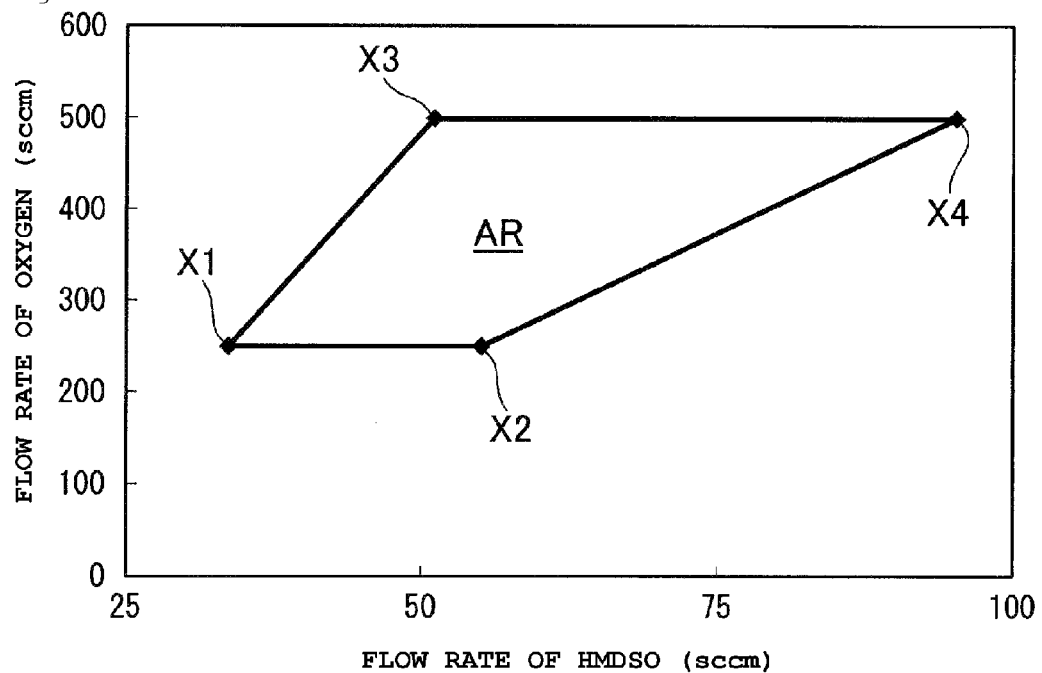
FIG. 4 is a view for illustrating a method for determining film-forming conditions at the time of producing the laminate film of the present embodiment.

FIG. 4 is a view obtained by converting the relationship, which is established between the flow rate of HMDSO and the flow rate of oxygen that are obtained from the points indicated by signs X1 to X4 of FIG. 3, into a graph in which the abscissa indicates the flow rate of HMDSO and the ordinate indicates the flow rate of HMDSO. In FIG. 4, an area AR, which is surrounded by a line segment formed when signs X1, X2, X4, X3, and X1 are connected to one another in this order by a line segment, shows the flow rate of HMDSO and the flow rate of oxygen that make the average of atomic ratio of carbon fall within a range from 11 at % to 21 at %. That is, when the graph of FIG. 4 is plotted, for forming a film, the flow rate of HMDSO and oxygen is controlled to be the amount that may be included in the area AR. Consequentially, the average of atomic ratio of carbon of the obtained thin film layer may be controlled to be within a range from 11 at % to 21 at %.

In the above description, the condition in which the flow rate of oxygen is set to 250 sccm and 500 sccm is exemplified. However, needless to say, the relationship between the flow rate of HMDSO and the flow rate of oxygen, which is established when the flow rate of oxygen is lower than 250 sccm or higher than 500 sccm, may also be determined by performing the aforementioned same operation.

In this manner, the reaction conditions may be set by controlling the amount of HMDSO and oxygen, and a thin film layer in which the average of atomic ratio of carbon is from 11 at % to 21 at % may be formed.

In the above description, the graph was obtained by conducting plotting for three points determined when the amount of HMDSO is varied relative to the flow rate of oxygen. However, even when there are two points at the level determined when the amount of HMDSO is varied relative to the flow rate of oxygen, if the average of atomic ratio of carbon in the two points is less than 11 at % and greater than 21 at % respectively, a graph corresponding to FIG. 3 may be drawn from the results obtained from the two points. Needless to say, a graph corresponding to FIG. 3 may be drawn from the results obtained from four or more points.

In addition, for example, the amount of film-forming gas may be fixed, and then the power applied to the first film-forming roll 17 and the second film-forming roll 18 may be varied, so as to find the relationship established between variation of the voltage and the average of atomic ratio of carbon. In the same manner as described above, the applied voltage at which the average of atomic ratio of carbon becomes an intended value may be determined.

By the plasma CVD method in which the film-forming conditions are specified in the manner described above and which uses the electric discharge plasma, the thin film layer may be formed on the substrate surface, and the laminate film of the present embodiment may be produced.

In the laminate film of the present embodiment, the average density of the thin film layer to be formed is 2.0 g/cm$^3$ or higher.

It is considered that in the thin film layer, the layer containing a large amount of $SiO_xC_y$ generated by the incomplete oxidation reaction has a structure that is formed when oxygen atoms of the network structure of $SiO_2$ (density: 2.22 g/cm$^3$) are substituted with carbon atoms. When the layer containing a large amount of $SiO_xC_y$ has a structure that is formed when oxygen atoms of $SiO_2$ are substituted with a large amount of carbon atoms (that is, when the average of atomic ratio of carbon of thin film layer increases), due to a difference between a bond length (about 1.63 Å) of an sp3 bond of Si—O and a bond length (about 1.86 Å) of an sp3 bond of Si—C, the molecular volume increases, and accordingly, the average density of the thin film layer decreases. However, when the average of atomic ratio of carbon of the thin film layer is from 11 at % to 21 at %, the average density of the thin film layer becomes 2.0 g/cm$^3$ or higher.

According to the laminate film of the present embodiment that satisfies the conditions (a) to (d), it is possible to obtain a laminate film which may maintain a high degree of gas barrier properties although being bent.

[Organic EL Device]

Figure 5:
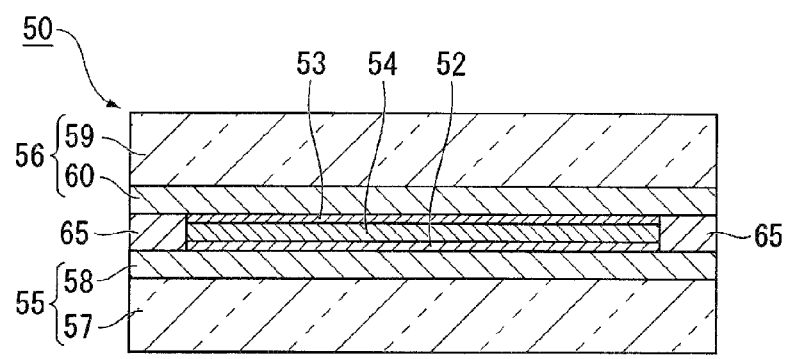
FIG. 5 is a lateral cross-sectional view of the organic electroluminescence device of the present embodiment.

FIG. 5 is a lateral cross-sectional view showing an example of constitution of the organic electroluminescence (organic EL) device of the present embodiment.

The organic EL device according to the present embodiment is applicable to various electronic devices utilizing light. The organic EL device of the present embodiment may be a part of a display portion of, for example, a mobile device or the like, or may be a part of an image forming apparatus such as a printer. The organic EL device of the present embodiment may be a light source (backlight) of, for example, a liquid crystal display panel or the like, or may be a light source of, for example, a lighting device or the like.

Figure 6:
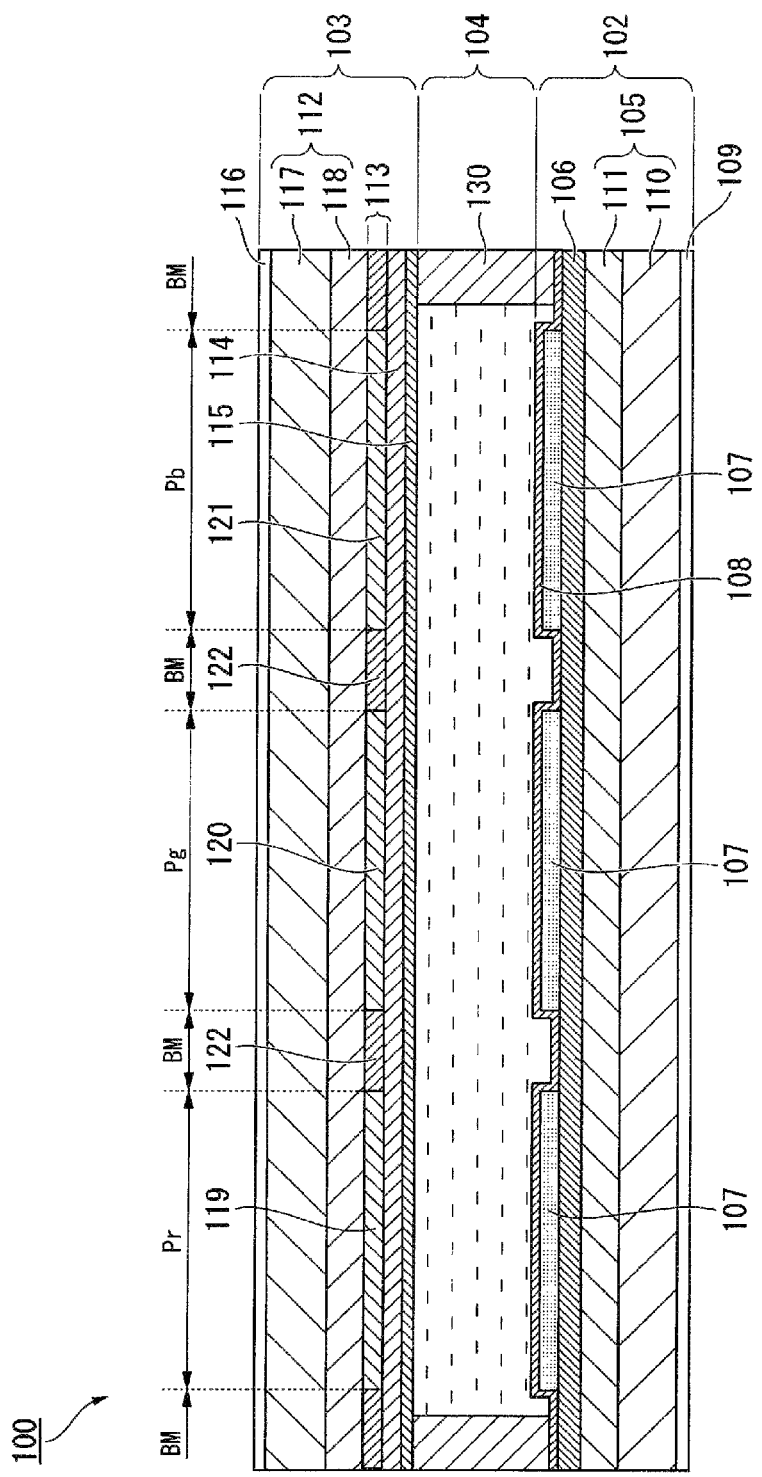
FIG. 6 is a lateral cross-sectional view of the photoelectric conversion device of the present embodiment.

An organic EL device 50 shown in FIG. 6 has a first electrode 52, a second electrode 53, a luminescent layer 54, a laminate film 55, a laminate film 56, and a sealant 65. As the laminate films 55 and 56, the aforementioned laminate film of the present embodiment is used. The laminate film 55 has a substrate 57 and a barrier film 58, and the laminate film 56 has a substrate 59 and a barrier film 60.

The luminescent layer 54 is disposed between the first electrode 52 and the second electrode 53, and the first electrode 52, the second electrode 53, and the luminescent layer 54 form an organic EL element. The laminate film 55 is disposed at the side of the first electrode 52 that is opposite to the luminescent layer 54. The laminate film 56 is disposed at the side of the second electrode 53 that is opposite to the luminescent layer 54. The laminate film 55 and the laminate film 56 are boned to each other by the sealant 65 which is disposed in a state of surrounding the organic EL element, and form a sealing structure that seals the inside of the organic EL element.

When power is supplied between the first electrode 52 and the second electrode 53 in the organic EL device 50, carriers (electrons and holes) are supplied to the luminescent layer 54, and the luminescent layer 54 emits light. The source for supplying power to the organic EL device 50 may be mounted on the organic EL device 50 or may be disposed outside the device. The light emitted from the luminescent layer 54 is used for displaying or forming images or for lighting according to the use or the like of an apparatus having the organic EL device 50.

In the above organic EL device 50 of the present embodiment, as materials for forming the first electrode 52, the second electrode 53, and the luminescent layer 54 (as materials for forming the organic EL element), generally known materials are used. Generally, materials for forming an organic EL device are known to easily deteriorate due to moisture or oxygen. However, in the organic EL device 50 of the present embodiment, the organic EL element is sealed by a sealing structure surrounded by the laminate films 55 and 56 of the present embodiment that may maintain a high degree of gas barrier properties although being bent and the sealant 65. Accordingly, it is possible to obtain a highly reliable organic EL device 50 that deteriorates in a small extent although being bent.

In the above description, the organic EL device 50 of the present embodiment uses the laminate films 55 and 56 of the present embodiment. However, one of the laminate films 55 and 56 may be a gas barrier substrate having other constitutions.

[Liquid Crystal Display]

FIG. 6 is a lateral cross-sectional view of the liquid crystal display according to the present embodiment.

A liquid crystal display 100 shown in the drawing has a first substrate 102, a second substrate 103, and a liquid crystal layer 104. The first substrate 102 is disposed to face the second substrate 103. The liquid crystal layer 104 is disposed between the first substrate 102 and the second substrate 103. The liquid crystal display 100 is produced by, for example, bonding the first substrate 102 to the second substrate 103 by using a sealant 130, and enclosing the liquid crystal layer 104 in a space surrounded by the first substrate 102, the second substrate 103, and the sealant 130.

The liquid crystal display 100 has a plurality of pixels, and the plurality of pixels are arranged in the form of a matrix. The liquid crystal display 100 may display a full color image. Each of the pixels of the liquid crystal display 100 has a subpixel Pr, a subpixel Pg, and a subpixel Pb. Between the subpixels, a light-shielding region BM is formed. The three types of subpixels emit color lights, which differ from each other in terms of tone, to the display side of an image in response to image signals. In the present embodiment, red light is emitted from the subpixel Pr, green light is emitted from the subpixel Pg, and blue light is emitted from the subpixel Pb. A combination of the lights of three colors that are emitted from the three types of subpixels is visually recognized, and as a result, one pixel of full color is displayed.

The first substrate 102 has a laminate film 105, an element layer 106, a plurality of pixel electrodes 107, an alignment film 108, and a polarizer plate 109. The pixel electrode 107 and a common electrode 114, which will be described later, form a pair of electrodes. The laminate film 105 has a substrate 110 and a barrier film 111. The support substrate 110 is in the form of a thin plate or a film. The barrier film 111 is formed on one surface of the support substrate 110. The element layer 106 is formed by being layered on the barrier film 111 formed on the substrate 110. Each of the plurality of pixel electrodes 107 is disposed on the element layer 106 independently for the subpixel of the liquid crystal display 100. The alignment film 108 is disposed on the pixel electrodes 107 and between the pixel electrodes 107 over the plurality of subpixels.

A second substrate 103 offers a laminate film 112, a color filter 113, a common electrode 114, an alignment film 115, and a polarizer plate 116. The laminate film 112 has a substrate 117 and a barrier film 118. The substrate 117 is in the form of a thin plate or a film. The barrier film 118 is formed on one surface of the substrate 117. The color filter 113 is formed by being layered on the barrier film 111 formed on the substrate 110. The common electrode 114 is disposed on the color filter 113. The alignment film 115 is disposed on the common electrode 114.

The first substrate 102 and the second substrate 103 are disposed such that the pixel electrode 107 faces the common electrode 114, and bonded to each other in a state where the liquid crystal layer 104 is disposed therebetween. The pixel electrodes 107, the common electrode 114, and the liquid crystal layer 104 form a liquid crystal display element. Furthermore the laminate film 105 and the laminate film 112 form a sealing structure that seals the inside of the liquid crystal display element, in cooperation with the sealant 130 that is disposed while surrounding the liquid crystal display element.

In the above liquid crystal display 100, the laminate film 105 and the laminate film 112 of the present embodiment having a high degree of gas barrier properties form a part of the sealing structure that seals the inside of the liquid crystal display element. Accordingly, it is possible to obtain a highly reliable liquid crystal display 100 which is less likely to experience deterioration of the liquid crystal display element due to oxygen or moisture in the air and less likely to show performance degradation, although the display is bent.

Regarding the liquid crystal display 100 of the present embodiment, the case of using the laminate films 105 and 112 of the present embodiment was described. However, one of the laminate films 105 and 112 may be a gas barrier substrate having other constitutions.

[Photoelectric Conversion Device]

Figure 7:
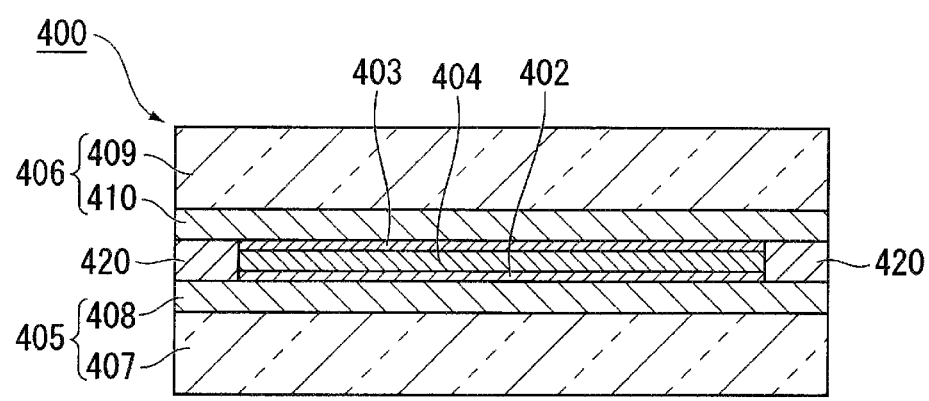
FIG. 7 is a lateral cross-sectional view of a liquid crystal device of the present embodiment.

FIG. 7 is a lateral cross-sectional view of the photoelectric conversion device of the present embodiment. The photoelectric conversion device of the present embodiment is usable for various devices that convert light energy to electric energy, such as light-detecting sensors or solar cells.

A photoelectric conversion device 400 shown in the drawing has a first electrode 402, a second electrode 403, a photoelectric conversion layer 404, a laminate film 405, and a laminate film 406. The laminate film 405 has a substrate 407 and a barrier film 408. The laminate film 406 has a substrate 409 and a barrier film 410. The photoelectric conversion layer 404 is disposed between the first electrode 402 and the second electrode 403, and the first electrode 402, the second electrode 403, and the photoelectric conversion layer 404 form a photoelectric conversion element.

The laminate film 405 is disposed at the side of the first electrode 402 that is opposite to the photoelectric conversion layer 404. The laminate film 406 is disposed at the side of the second electrode 403 that is opposite to the photoelectric conversion layer 404. The laminate film 405 and the laminate film 406 are bonded to each other by a sealant 420 that is disposed while surrounding the photoelectric conversion element, and form a sealing structure that seals the inside of the photoelectric conversion element.

In the above photoelectric conversion device 400, the first electrode 402 is a transparent electrode, and the second electrode 403 is a reflector electrode. In the photoelectric conversion device 400 of the present example, light energy of light having entered the photoelectric conversion layer 404 through the first electrode 402 is converted into electric energy in the photoelectric conversion layer 404. The electric energy is taken out of the photoelectric conversion device 400 via the first electrode 402 and the second electrode 403. The material etc. of the respective constituents, which are disposed in light path of the light entering the photoelectric conversion layer 404 from the outside of the photoelectric conversion device 400, are selected such that the part corresponding to the light path has light permeability as appropriate. The constituents disposed in a part not included in the light path of the light from the photoelectric conversion layer 404 may be formed of materials having light permeability or materials that partially or totally block the light.

In the above photoelectric conversion device 400 of the present embodiment, as the first electrode 402, the second electrode 403, and the photoelectric conversion layer 404, generally known materials are used. In the photoelectric conversion device 400 of the present embodiment, the photoelectric conversion element is sealed with a sealing structure surrounded by the laminate films 405 and 406 of the present embodiment having a high degree of gas barrier properties and the sealant 420. Accordingly, it is possible to obtain a highly reliable photoelectric conversion device 400 which is less likely to experience deterioration of the photoelectric conversion layer or electrodes due to oxygen or moisture in the air and less likely to show performance degradation, although the device is bent.

Regarding the photoelectric conversion device 400 of the present embodiment, the case where the photoelectric conversion element is interposed between the laminate films 405 and 406 of the present embodiment was described. However, one of the laminate films 405 and 406 may be a gas barrier substrate having other constitutions.

Up to now, examples of preferable embodiments according to the present invention have been described with reference attached drawings. However, needless to say, the present embodiment is not limited to the examples. The form, combination, etc. of the respective constituent members described in the above examples are merely examples, and within a range that does not depart from the gist of the present embodiment, they may be modified in various ways based on requirements of design etc.

EXAMPLE

Hereinafter, the present invention will be described in more detail based on examples and comparative examples, but the present invention is not limited to the examples given below. Each of the values measured for the laminate film was obtained by measuring the film by the following method.

[Measuring Method]
(1) Measurement of Water Vapor Transmittance

A water vapor transmission rate of the laminate film was measured using a water vapor transmission rate measuring instrument (manufactured by GTR Tec Corporation, GTR Tec-30XASC), under conditions of a temperature of 40° C., a humidity of a low-humidity side of 0% RH, and a humidity of a high-humidity side of 90% RH.

A detection limit of the measuring instrument used in the "(1) Measurement of water vapor transmittance" is $1 \times 10^{-4}$ g/(m$^2$·day).

(2) Measurement of Water Vapor Transmission Rate after Bending Test

First, for performing a bending test of the laminate film, the laminate film to be measured was wound around a cylindrical rod made of metal, left as is for 1 minute, and then wound off to restore its original flat shape. In the bending test, a radius of curvature R corresponds to a radius of the rod around which the laminate film is wound. However, when the laminate film was wound around the rod many times, a half of the film diameter up to the outer circumference of the film wound around the rod was taken as the radium of curvature R.

The water vapor transmission rate of the laminate film having undergone the bending test was measured for the laminate film having undergone the bending test, by using a water vapor transmission rate measuring instrument (manufactured by Lyssy, Lyssy-L80-5000) under conditions of a temperature of 40° C., a humidity of a low-humidity side of 10% RH, and a humidity of a high-humidity side of 100% RH.

A detection limit of the measuring instrument used in the "(2) Measurement of water vapor transmission rate after bending test" is $2 \times 10^{-2}$ g/(m$^2$·day).

Regarding the laminate film subjected to the bending test, it was confirmed when being measured by the same measuring instrument, the laminate film has a water vapor transmission rate equal to or lower than the detection limit before the bending test. The laminate film was measured to determine whether or not the water vapor transmission rate thereof may be detected after the bending test, and in this manner, whether or not the gas barrier properties deteriorate after the bending test was confirmed.

All of the "(1) Measurement of water vapor transmittance" and "(2) Measurement of water vapor transmission rate after bending test" were conducted according to Appendix C "Determination of water vapor transmission rate by gas chromatography" of JIS K 7129:2008 "Plastics-Film and sheeting-Determination of water vapor transmission rate (instrumental method)" (hereinafter, it will sometimes be referred to as "gas chromatography of JIS").

(3) Measurement of Film Thickness of Thin Film Layer

A film thickness of the thin film layer was measured by observing the cross-section of a slice of the thin film layer prepared by a Focused Ion Beam (FIB) process, by using a transmission electron microscope (manufactured by Hitachi, Ltd., HF-2000).

(FIB Condition)
Device: SMI-3050 (manufactured by Seiko Instruments Inc.)
Acceleration voltage: 30 kV (4) Distribution Curve of Each Element of Thin Film Layer Regarding the thin film layer of the laminate film, distribution curves of silicon atoms, oxygen atoms, and carbon atoms were obtained by XPS depth profile analysis performed under the following conditions. The curves were made into a graph in which the abscissa indicates a depth (nm) of the thin film layer measured from the surface, and the ordinate indicates a percentage of atoms of each element.

(Analysis Conditions)
Etching ion: argon (Ar$^+$)
Etching rate (expressed in terms of SiO$_2$ thermal oxide film): 0.05 nm/sec
Etching interval (expressed in terms of SiO$_2$ thermal oxide film): 10 nm
X-ray photoelectron spectroscopy instrument: VG Theta Probe manufactured by Thermo Fisher Scientific, Inc.
Irradiation X-ray: single-crystal spectroscopic AlKα
Spot shape and spot diameter of X-ray: ellipse of 800×400 μm (5) Measurement of Light Transmittance A light transmission spectrum of the laminate film was measured using a UV-visible near infrared spectrophotometer (manufactured by JASCO Corporation, trade name Jasco V-670) based on JIS R1635, and a visible light transmittance at a wavelength of 550 nm was taken as a light transmittance of the laminate film.

(Measuring Conditions)
Integrating sphere: None
Range of wavelength measured: 190 nm to 2700 nm
Spectrum width: 1 nm
Wavelength scanning speed: 2,000 nm/min
Response: Fast (6) Measurement of Average Density of Thin Film Layer and Ratio of Number of Hydrogen Atom Measurement of the density of the thin film layer and measurement of a ratio of number of hydrogen atoms (measurement for confirming the presence of hydrogen atoms) were conducted by Rutherford Backscattering Spectrometry (RBS) and Hydrogen Forward scattering Spectrometry (HFS).

For the measurement by the RBS method and the HFS method, the following measuring instruments were used in common.

(Measuring Instruments)
Accelerator: accelerator from National Electrostatics Corp. (NEC)
Analyzer: End Station manufactured by Evans Analytical Group, Inc.

(i. Measurement by RBS Method)

He ion beams were used as incident light that entered the thin film layer of the laminate film in a normal line direction of the surface of the thin film layer, and energy of the He ions scattering backward from the incident direction. In this manner, an RBS spectrum was obtained.

(Analysis Conditions)
$He^{++}$ ion beam energy: 2.275 MeV
RBS detection angle: 160°
Grazing angle with respect to incident direction of ion beams: about 115°
Analysis Mode: Rotation Random (RR)

(ii. Measurement by HFS Method)

He ion beams were used as incident light that entered the thin film layer of the laminate film in a direction forming an angle of 75° with respect to the normal line direction of the surface of the thin film layer (a direction forming an angle of elevation of 15° with respect to the surface of the thin film layer), and energy and yield of hydrogen scattering forward at an angle of 30° from the incident direction of the ion beams were detected. In this manner, an HFS spectrum was obtained.

(Analysis Condition)
$He^{++}$ ion beam energy: 2.275 MeV
Detection angle: 160°
Grazing angle with respect to incident direction of ion beams: about 30°

From the number of silicon atoms, number of carbon atoms, and number of oxygen atoms obtained by the RBS method and the number of hydrogen atoms obtained by the HFS method, the weight of the thin film layer within a measurement range was calculated, and the obtained weight was divided by the volume of the thin film layer within a measurement range (a product of the area irradiated with the ion beams and film thickness), thereby calculating the average density of the thin film layer.

The ratio of number of hydrogen atoms (atomic percentage) was obtained by calculating a ratio of the number of hydrogen atoms to the sum of the number of silicon atoms, number of carbon atoms, and number of oxygen atoms obtained by the RBS method and the number of hydrogen atoms obtained by the HFS method.

(7) $^{29}$Si-Solid-State NMR Spectrum Analysis

A $^{29}$Si-solid-state NMR spectrum was analyzed using a nuclear magnetic resonance instrument (AVANCE300 manufactured by Bruker Corporation) under the following condition.

(Analysis Condition)
Number of times of integration: 49152
Relaxation time: 5 seconds
Resonance frequency: 59.5815676 MHz
MAS spinning: 3 kHz
CP method A peak area of the solid-state NMR was calculated in the following manner. In the present example, it is known that the thin film layer to be measured contains silicon atoms of $Q^3$ or $Q^4$ but do not contain silicon atoms of $Q^1$ or $Q^2$.

First, the spectrum obtained by the $^{29}$Si-solid-state NMR analysis was subjected to smoothing processing.

That is, the spectrum obtained by the $^{29}$Si-solid-state NMR analysis was subjected to Fourier transform, a high frequency of equal to or higher than 100 Hz was removed, and then inverse Fourier transform is conducted, thereby performing the smoothing processing (low-pass filter processing). In the following description, the spectrum having undergone smoothing is referred to as an "analysis spectrum".

Thereafter, the analysis spectrum was divided according to the peak of $Q^3$ and $Q^4$. That is, on the assumption that the peak of $Q^3$ the peak of $Q^4$ may respectively exhibit a Gaussian distribution curve (normal distribution curve) based on chemical shift ($Q^3$: −102 ppm, $Q^4$: −112 ppm) of their own, parameters such as a height of peak, full with at half maximum, etc. were optimized such that a model spectrum obtained by summing up $Q^3$ and $Q^4$ matched with the analysis spectrum having undergone smoothing.

The parameters were optimized by iteration, and parameters that make the sum of the square of a deviation between the model spectrum and the analysis spectrum converge to a minimum value were calculated.

Thereafter, an area of a part surrounded by the peaks of $Q^3$ and $Q^4$ obtained as above and a base line was determined by integration, thereby calculating a peak area of $Q^3$ and $Q^4$. By using the calculated peak area, the value of (peak area of $Q^3$)/(peak area of $Q^4$) was obtained, and the relationship between the value of (peak area of $Q^3$)/(peak area of $Q^4$) and gas barrier properties was confirmed.

Example 1

A laminate film was produced using the production apparatus show in FIG. 2 described above.

That is, a biaxially drawn polyethylene naphthalate film (PEN film, thickness: 100 μm, width: 350 mm, manufactured by Teijin DuPont Films Japan Limited, trade name "Teonex Q65FA") was used as a substrate (substrate F) and mounted on the feeding roll 11.

Thereafter, when a magnetic field in the form of an endless tunnel was formed in a space between the first film-forming roll 17 and the second film-forming roll 18, film-forming gas (mixed gas consisting of raw material gas (HMDSO) and reactant gas (oxygen gas)) was supplied; each of the first film-forming roll 17 and the second film-forming roll 18 was supplied with power such that electric discharge was caused between the first film-forming roll 17 and the second film-forming roll 18; and a film was formed by a plasma CVD method under the following condition. A laminate film 1 was obtained by this process.

(Film-Forming Condition)
Amount of raw material gas supplied: 50 sccm
Amount of oxygen gas supplied: 250 sccm
Degree of vacuum of inside of vacuum chamber: 3 Pa
Power applied from power source for plasma generation: 0.8 kW
Frequency of power source for plasma generation: 70 kHz
Transport speed of film: 0.5 m/min The obtained laminate film 1 was subjected to an FIB process, and a TEM image of the cross-section of a slice thereof was confirmed. As a result, it was confirmed that four layers having different colors were formed (it was confirmed that two upper layers are protective layers that are provided onto the thin film layer at the time of FIB process, and two layers under the protective layers are a thin film layer and a substrate in this order).

Figure 8:
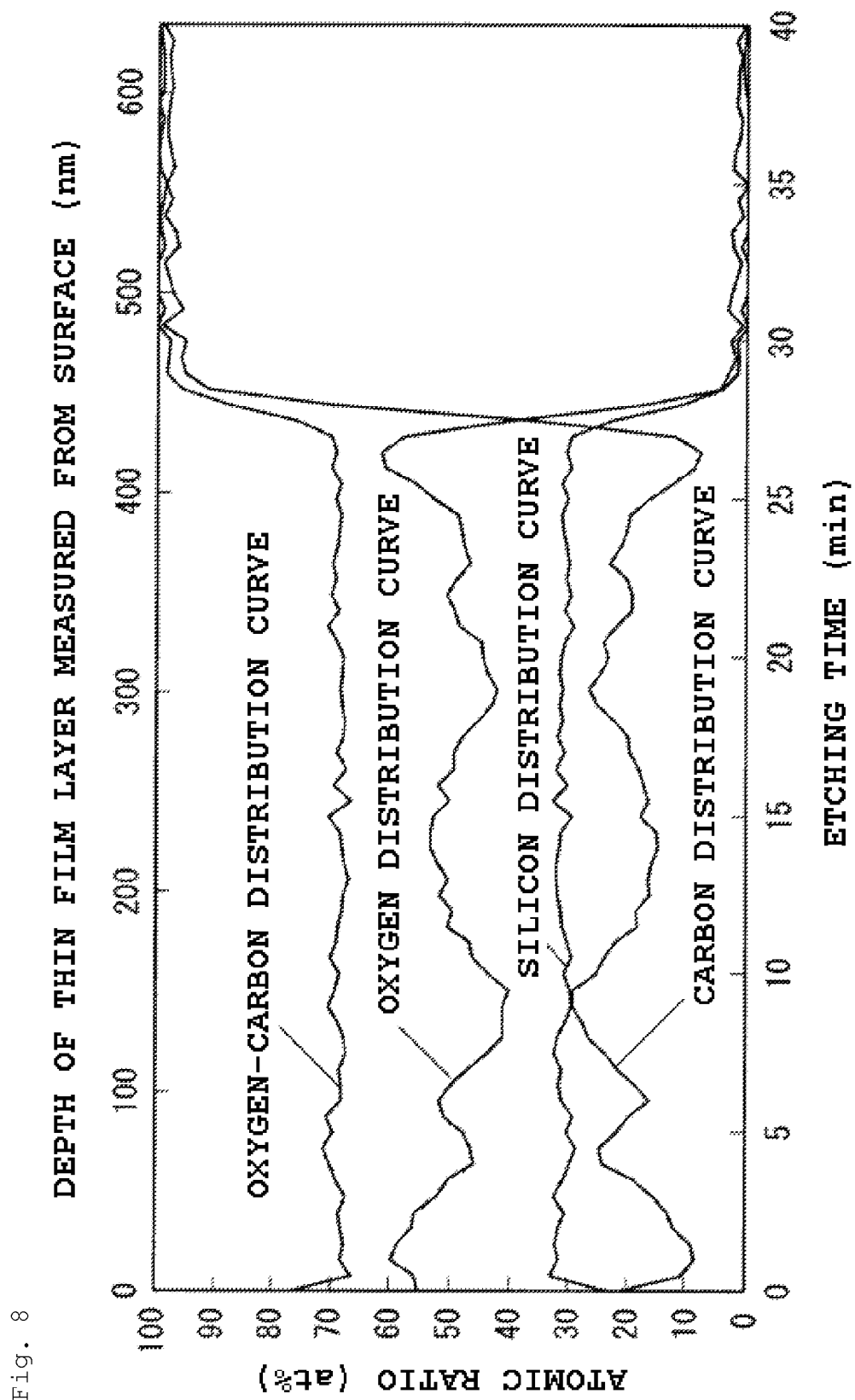
FIG. 8 is a graph showing a silicon distribution curve, an oxygen distribution curve, a carbon distribution curve, and an oxygen-carbon distribution curve of a thin film layer of a laminate film 1 obtained in Example 1.

Furthermore, a carbon distribution curve, a silicon distribution curve, an oxygen distribution curve, and a carbon-oxygen distribution curve relating to the obtained laminate film 1 are shown in FIG. 8.

Comparative Example 1

Figure 9:
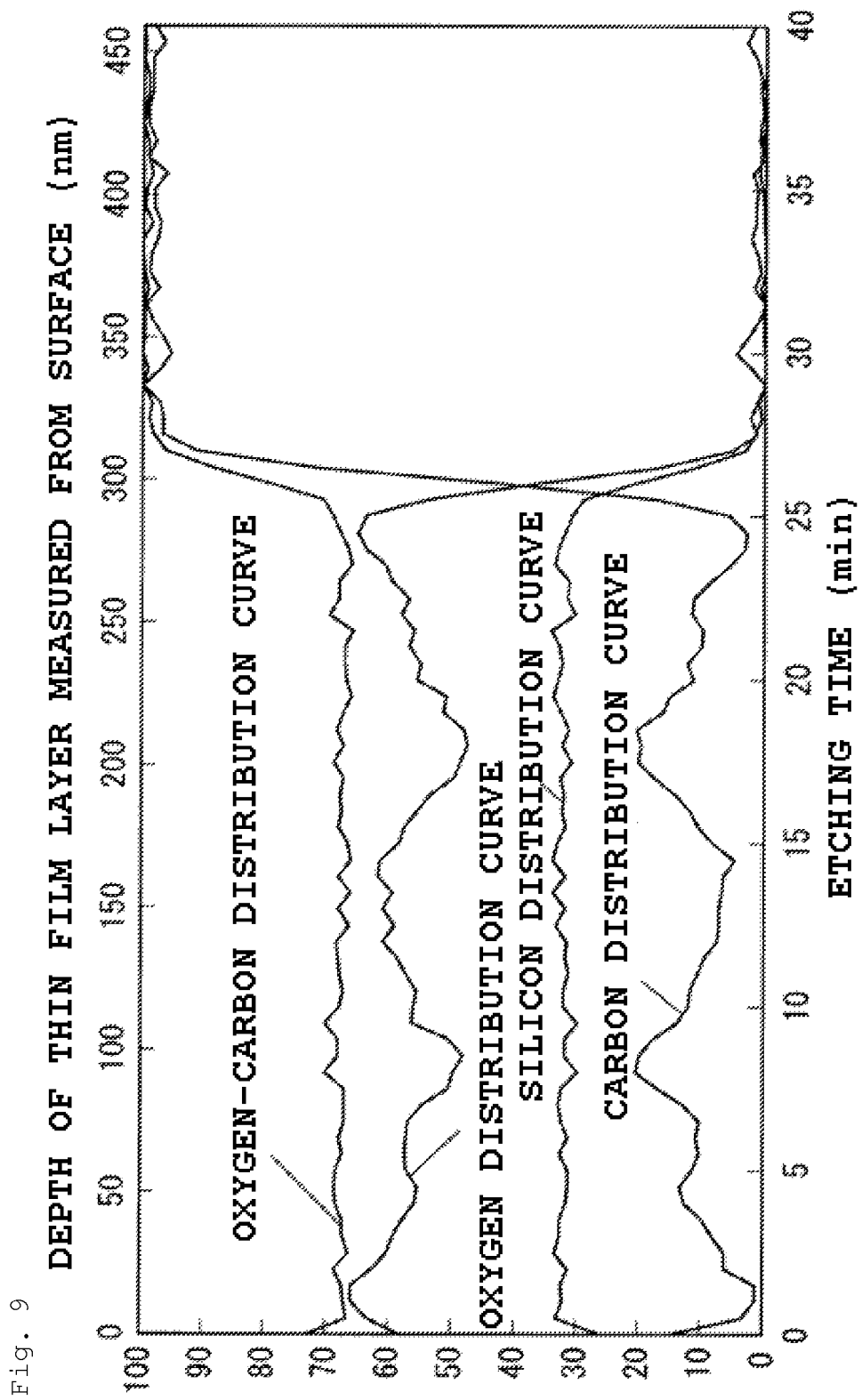
FIG. 9 is a graph showing a silicon distribution curve, an oxygen distribution curve, a carbon distribution curve, and an oxygen-carbon distribution curve of a thin film layer of a laminate film 2 obtained in Comparative Example 1.

A laminate film 2 was obtained in the same manner as in Example 1, except that the amount of oxygen gas supplied was set to 500 sccm. A carbon distribution curve, a silicon distribution curve, an oxygen distribution curve, and a carbon-oxygen distribution curve relating to the obtained laminate film 2 are shown in FIG. 9.

Comparative Example 2

Figure 10:
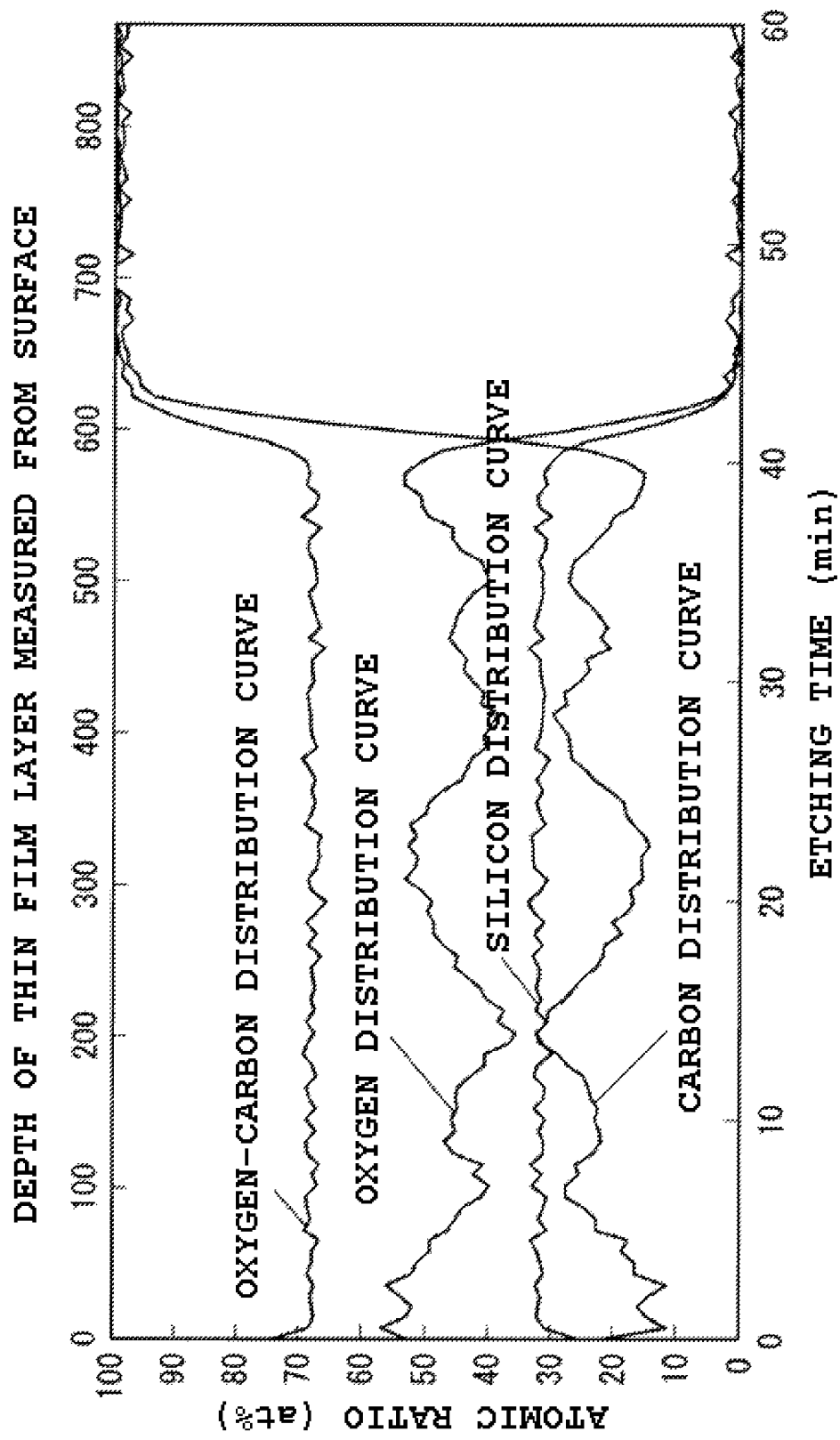
FIG. 10 is a graph showing a silicon distribution curve, an oxygen distribution curve, a carbon distribution curve, and an oxygen-carbon distribution curve of a thin film layer of a laminate film 3 obtained in Comparative Example 2.

A laminate film 3 was obtained in the same manner as in Comparative Example 1, except that the amount of raw material gas supplied was set to 100 sccm. A carbon distribution curve, a silicon distribution curve, an oxygen distribution curve, and a carbon-oxygen distribution curve relating to the obtained laminate film 3 are shown in FIG. 10.

Comparative Example 3

Figure 11:
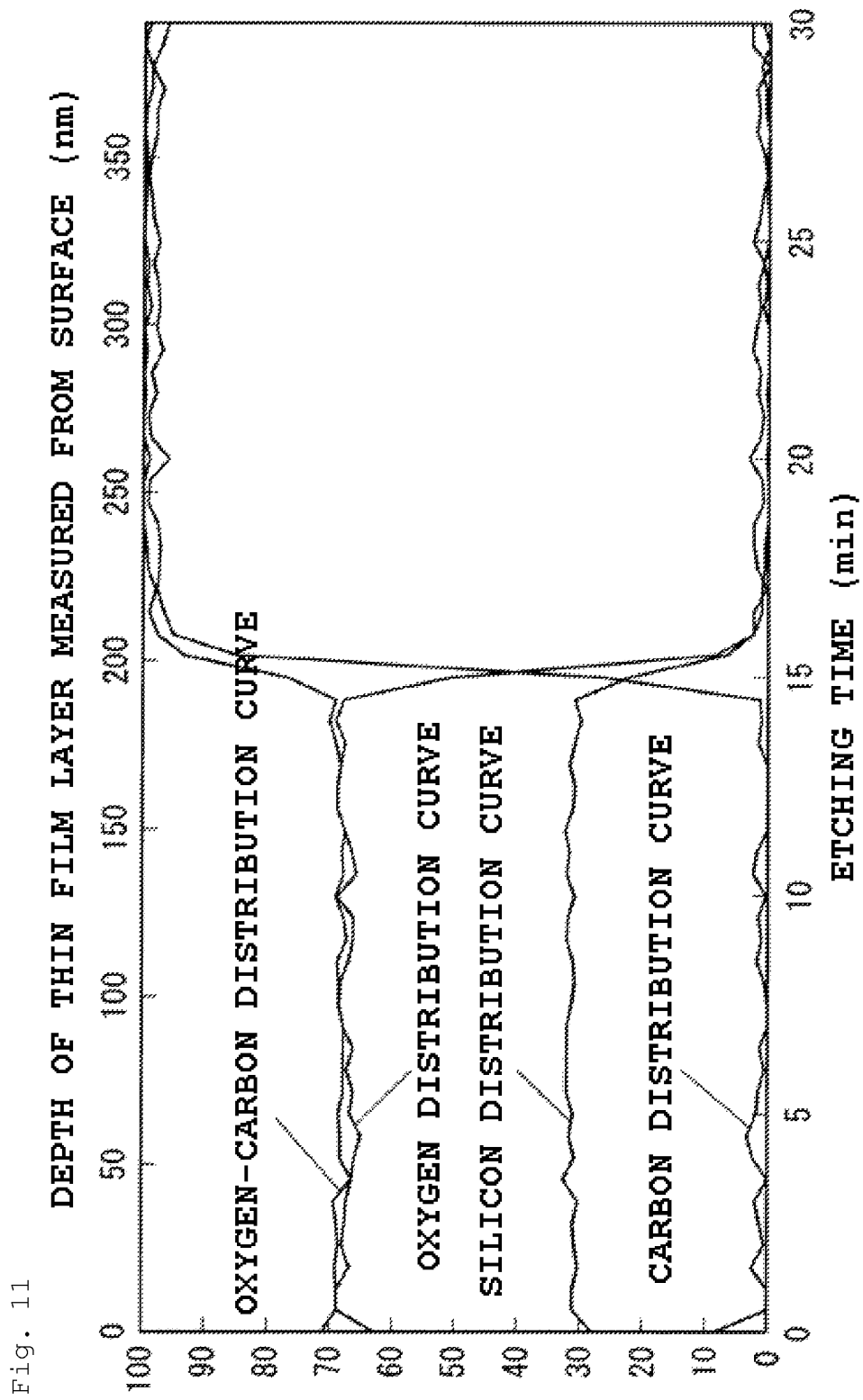
FIG. 11 is a graph showing a silicon distribution curve, an oxygen distribution curve, a carbon distribution curve, and an oxygen-carbon distribution curve of a thin film layer of a laminate film 4 obtained in Comparative Example 3.

A laminate film 4 was obtained in the same manner as in Comparative Example 1, except that the amount of raw material gas supplied was set to 25 sccm. A carbon distribution curve, a silicon distribution curve, an oxygen distribution curve, and a carbon-oxygen distribution curve relating to the obtained laminate film 4 are shown in FIG. 11.

Comparative Example 4

By using a biaxially drawn polyethylene naphthalate film (PEN film, thickness: 100 μm, size: 165 mm×170 mm, manufactured by Teijin DuPont Films Japan Limited, trade name "Teonex Q65FA") as a substrate and a batch-type plasma CVD device, a thin film was formed by a plasma CVD method.

Figure 12:
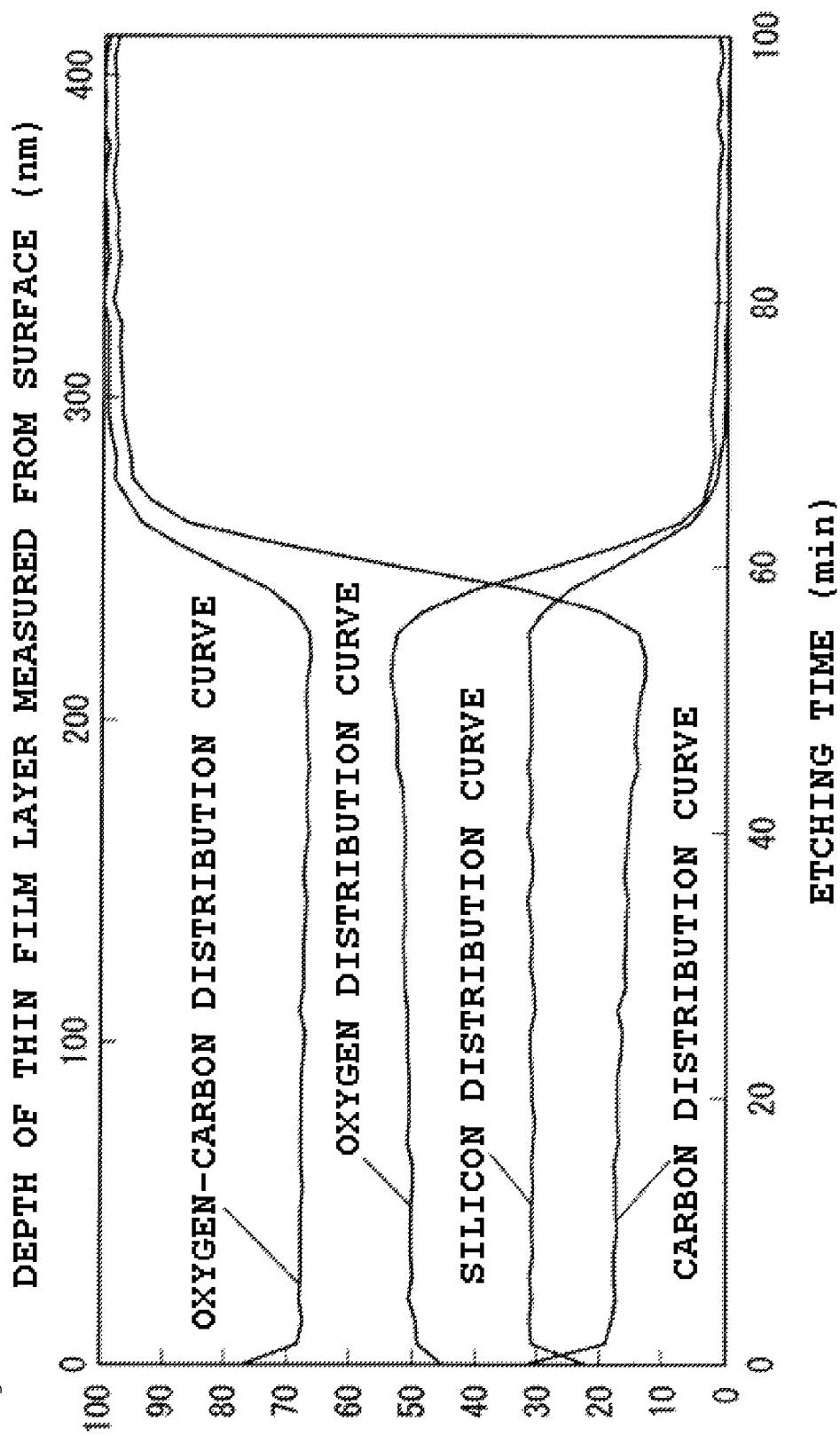
FIG. 12 is a graph showing a silicon distribution curve, an oxygen distribution curve, a carbon distribution curve, and an oxygen-carbon distribution curve of a thin film layer of a laminate film 5 obtained in Comparative Example 4.

For film-forming gas, HMDSO was used as raw material gas, and oxygen gas was used as reactant gas. A film was formed by controlling the amount of the supplied film forming gas such that the amount of HMDSO became 12 sccm and the amount of oxygen gas became 68 sccm, and in this manner, a laminate film 5 was obtained. A carbon distribution curve, a silicon distribution curve, an oxygen distribution curve, and a carbon-oxygen distribution curve relating to the obtained laminate film 5 are shown in FIG. 12.

Example 2

Figure 13:
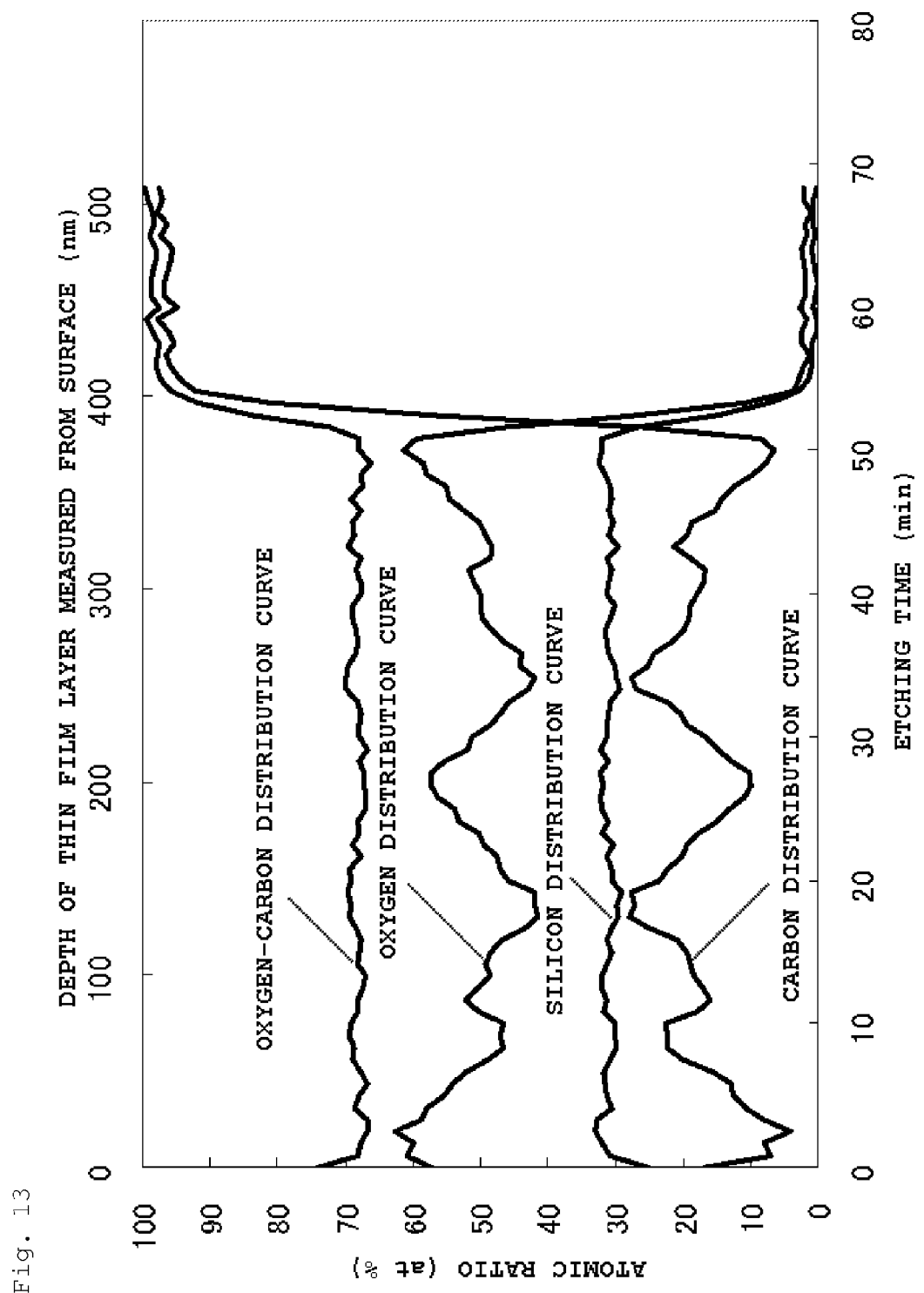
FIG. 13 is a graph showing a silicon distribution curve, an oxygen distribution curve, a carbon distribution curve, and an oxygen-carbon distribution curve of a thin film layer of a laminate film 6 obtained in Example 2.

A laminate film 6 was obtained in the same manner as in Example 1, except that the amount of oxygen gas supplied was set to 400 sccm. A carbon distribution curve, a silicon distribution curve, an oxygen distribution curve, and a carbon-oxygen distribution curve relating to the obtained laminate film 6 are shown in FIG. 13.

Example 3

Figure 14:
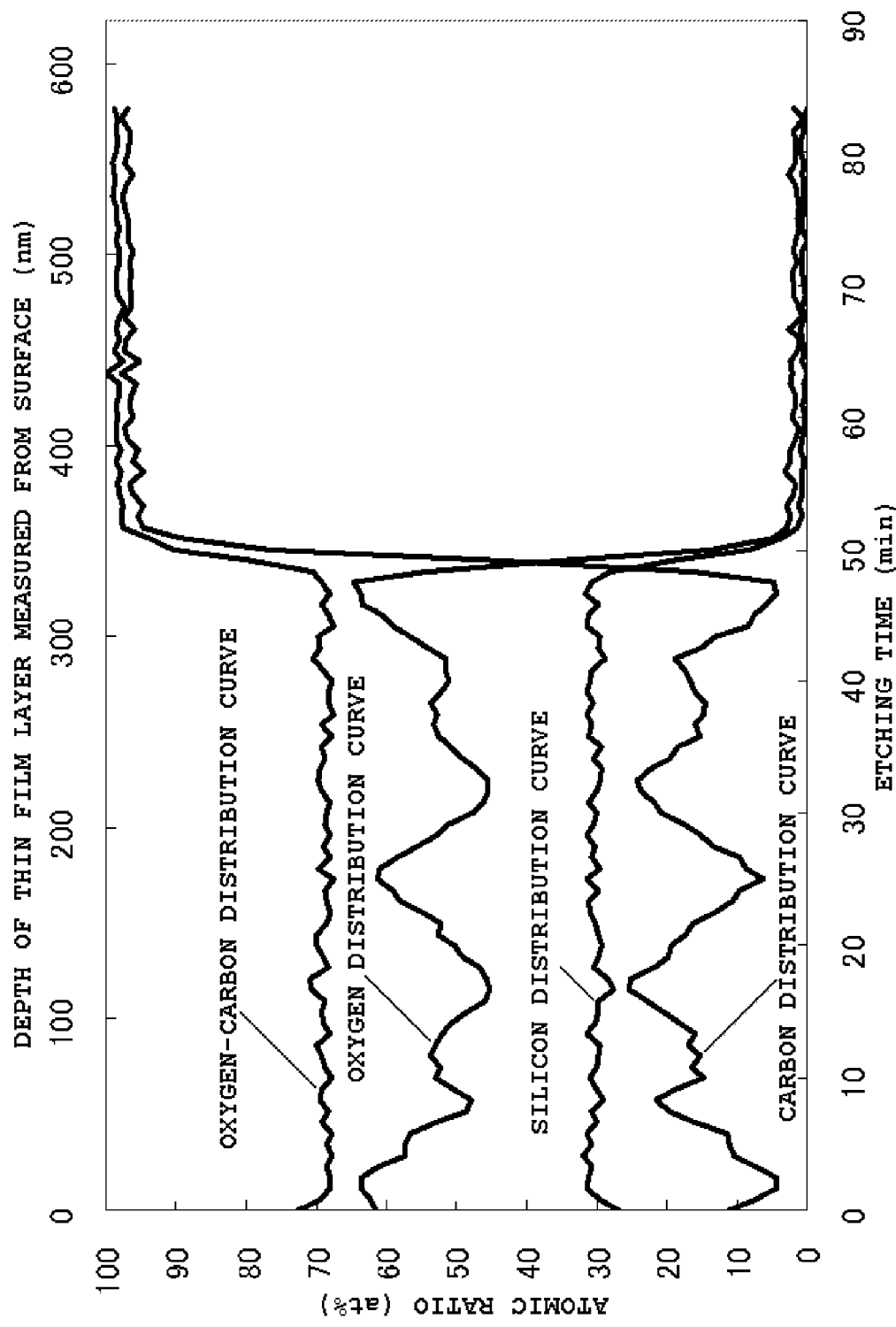
FIG. 14 is a graph showing a silicon distribution curve, an oxygen distribution curve, a carbon distribution curve, and an oxygen-carbon distribution curve of a thin film layer of a laminate film 7 obtained in Example 3.

A laminate film 7 was obtained in the same manner as in Example 1, except that the amount of oxygen gas supplied was set to 450 sccm. A carbon distribution curve, a silicon distribution curve, an oxygen distribution curve, and a carbon-oxygen distribution curve relating to the obtained laminate film 7 are shown in FIG. 14.

Example 4

Figure 15:
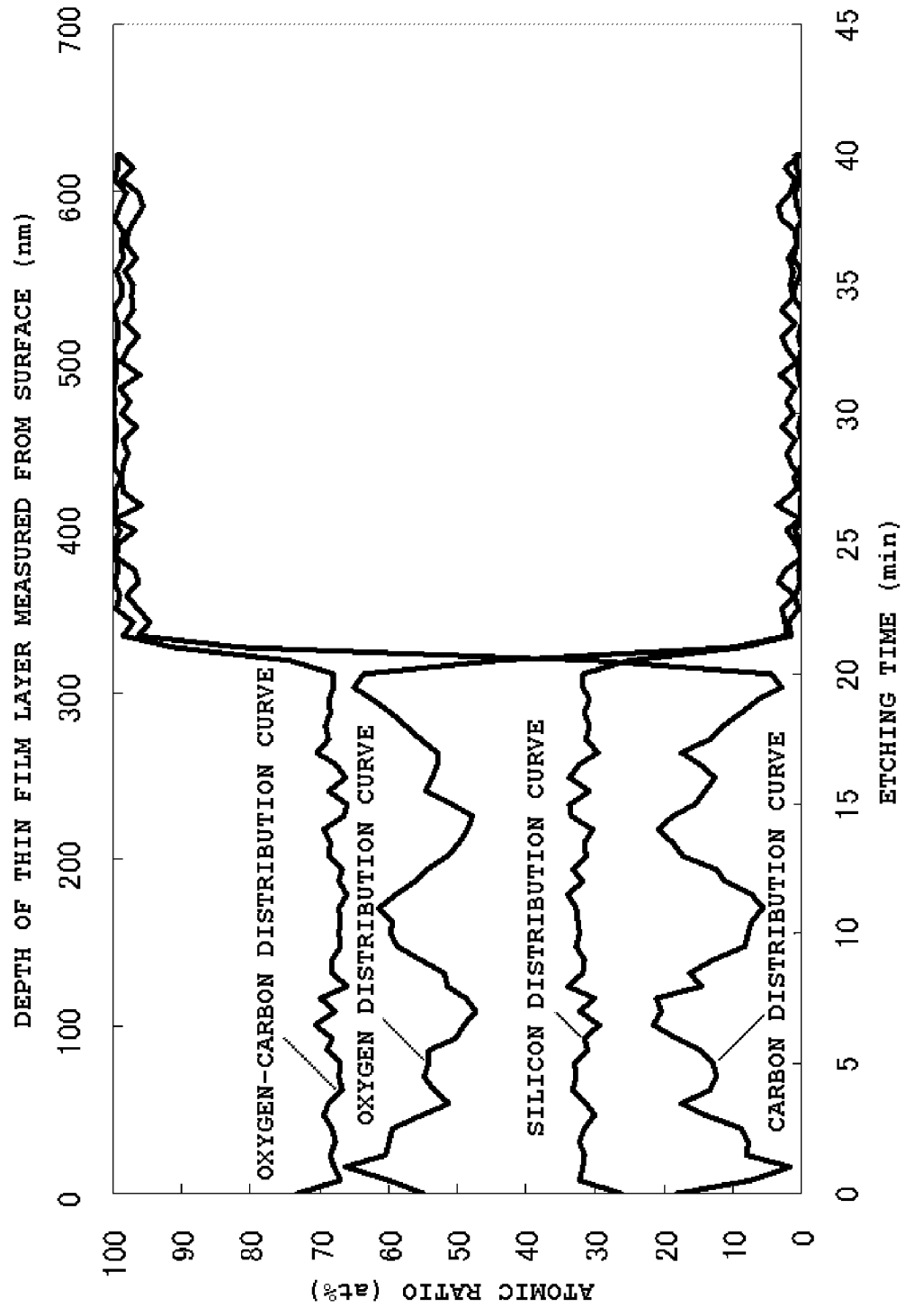
FIG. 15 is a graph showing a silicon distribution curve, an oxygen distribution curve, a carbon distribution curve, and an oxygen-carbon distribution curve of a thin film layer of a laminate film 8 obtained in Example 4.

A laminate film 8 was obtained in the same manner as in Example 1, except that the amount of oxygen gas supplied was set to 480 sccm. A carbon distribution curve, a silicon distribution curve, an oxygen distribution curve, and a carbon-oxygen distribution curve relating to the obtained laminate film 8 are shown in FIG. 15.

The results obtained by measuring each of the laminate films 1 to 5 of Example 1 and Comparative Examples 1 to 4 are shown in Table 1. The results obtained by measuring each of the laminate films 6 to 8 of Examples 2 to 4 are shown in Table 2.

TABLE 1

|  | Example 1 | Comparative Example 1 | Comparative Example 2 | Comparative Example 3 | Comparative Example 4 |
|---|---|---|---|---|---|
| Atomic ratio of carbon (average: at %) | 19.2 | 10.8 | 22.1 | 1.04 | 16.0 |
| Average density (g/cm$^3$) | 2.04 | 2.11 | 2.11 | 2.15 | 1.62 |
| Atomic ratio of carbon and oxygen (average: at %) | 68.9 | 67.8 | 68.1 | 68.5 | 67.4 |
| Region in which atomic ratio of silicon is 29 at % to 38 at % (%) | 98.1 | 98.1 | 98.8 | 100 | 100 |
| Difference in extremal values of carbon distribution curve (at %) | 21.6 | 19.3 | 20.7 | 3.3 | — |
| Ratio of number of hydrogen atoms (at %) | 24.0 | 17.6 | 20.5 | 8.0 | 25.0 |
| Film thickness (nm) | 440 | 300 | 600 | 200 | 250 |
| Water vapor transmission rate (g/(m$^2$·day)) | Equal to or lower than detection limit | $3.1 \times 10^{-4}$ | $3.2 \times 10^{-4}$ | $7.5 \times 10^{-3}$ | 1.3 |

TABLE 1-continued

|  |  |  | Example 1 | Comparative Example 1 | Comparative Example 2 | Comparative Example 3 | Comparative Example 4 |
|---|---|---|---|---|---|---|---|
| Water vapor transmission rate after bending test | Radius of curvature 8 mm | (g/(m² · day)) | Equal to or lower than detection limit | Equal to or lower than detection limit | Equal to or lower than detection limit | 0.27 | — |
|  | Radius of curvature 4 mm |  | Equal to or lower than detection limit | 0.036 | 0.029 | — | — |
| Light transmittance |  | (%) | 89.4 | 90.0 | 87.0 | 87.0 | 88.2 |

TABLE 2

|  |  |  | Example 2 | Example 3 | Example 4 |
|---|---|---|---|---|---|
| Atomic ratio of carbon (average: at %) |  |  | 17.9 | 15.5 | 12.7 |
| Average density (g/cm³) |  |  | 2.05 | 2.07 | 2.09 |
| Atomic ratio of carbon and oxygen (average: at %) |  |  | 68.2 | 68.8 | 68.0 |
| Region in which atomic ratio of silicon is 29 at % to 38 at % |  |  | 100 | 94.5 | 100 |
| Difference in extremal values of carbon distribution curve (at %) |  |  | 23.8 | 21.3 | 19.8 |
| Ratio of number of hydrogen atoms (at %) |  |  | 21.0 | 20.1 | 19.1 |
| Film thickness (nm) |  |  | 390 | 340 | 320 |
| Water vapor transmission rate |  | (g/(m² · day)) | Equal to or lower than detection limit | Equal to or lower than detection limit | Equal to or lower than detection limit |
| Water vapor transmission rate after bending test | Radius of curvature 8 mm | (g/(m² · day)) | Equal to or lower than detection limit | Equal to or lower than detection limit | Equal to or lower than detection limit |
|  | Radius of curvature 4 mm |  | Equal to or lower than detection limit | Equal to or lower than detection limit | Equal to or lower than detection limit |
| Light transmittance |  | (%) | 87.5 | 87.0 | 87.6 |

As a result of evaluation, it was confirmed that the laminate films 1 and 6 to 8 of Examples 1 to 4 maintained excellent gas barrier properties even after the bending test.

On the contrary, the laminate films 2 to 4 of Comparative Examples 1 to 3 showed deterioration of gas barrier properties due to the bending test.

It was found that the laminate film 5 of Comparative Example 4 had a water vapor transmission rate of 1.3 g/(m²·day) which was equivalent to the water vapor transmission rate of the PEN film as a substrate. Therefore, the thin film layer formed in this film was confirmed not to provide gas barrier properties.

From these results, it was confirmed that the laminate film of the present invention might maintain a high degree of gas barrier properties although being bent. The laminate film of the present invention may be preferably used for organic EL device, photoelectric conversion device, and liquid crystal display.

INDUSTRIAL APPLICABILITY

The present invention is a laminate film that may maintain a high degree of gas barrier properties although being bent. The laminate film is applicable to, for example, an organic electroluminescence device, a photoelectric conversion device, and a liquid crystal display.

REFERENCE SIGNS LIST 10 production apparatus
11 feeding roll
12 winding-up roll
13 to 16 transport roll
17 first film-forming roll
18 second film-forming roll
20 power source for plasma generation
23, 24 magnetic field-forming device
50 organic electroluminescence device
100 liquid crystal display
400 photoelectric conversion device
55, 56, 105, 106, 405, 406 laminate film
F film (substrate)
SP space (film-forming space)

The invention claimed is:

1. A laminate film comprising:
a substrate; and
at least one thin film layer which has been formed on at least one surface of the substrate,
wherein at least one of the thin film layer contains silicon atoms, oxygen atoms, and carbon atoms, and the thin film layer having a thickness of 320 nm or more
in a silicon distribution curve, an oxygen distribution curve, and a carbon distribution curve that respectively show relationship between a depth of the thin film layer, which is measured from the surface of the thin film layer in the film thickness direction of the thin film layer, and a ratio of number of silicon atoms (atomic ratio of silicon), a ratio of number of oxygen atoms (atomic ratio of oxygen), as well as a ratio of number of carbon atoms (atomic ratio of carbon) to a total number of silicon atoms, oxygen atoms, and carbon atoms which are positioned away from the surface by the depth and contained in the thin film layer, all of the following conditions (i) to (iii) are satisfied,
(i) the atomic ratio of silicon, the atomic ratio of oxygen, and the atomic ratio of carbon satisfy a condition represented by the following Formula (1) in a region that takes up for 90% or more of the thin film layer in the film thickness direction, (Atomic ratio of oxygen)>(atomic ratio of silicon)>(atomic ratio of carbon)  (1)

(ii) the carbon distribution curve has at least one extremal value,
(iii) an absolute value of a difference between a maximum value and a minimum value of atomic ratio of carbon in the carbon distribution curve is 5 at % or greater, an average of the atomic ratio of carbon obtained from the carbon distribution curve is from 12.7 at % to 19.5 at %, and an average density of the thin film layer is 2.0 g/cm³ or higher, and wherein an average of the atomic ratio of carbon and oxygen, which is obtained from the carbon-oxygen distribution curve showing relationship between the depth and a ratio of a total number of carbon atoms and oxygen atoms (atomic ratio of carbon and oxygen) to the total number, is from 63.7 at % to 68.9 at %.

2. The laminate film according to claim 1, wherein the thin film layer further contains hydrogen atoms, and a ratio of a value, which is obtained by summing up peak areas of $Q^1$, $Q^2$, and $Q^3$, to a peak area of $Q^4$ desirably satisfies the following condition (I), based on a silicon atom abundance ratio which is obtained by performing $^{29}$Si solid-state NMR analysis on silicon atoms of the thin film layer that bind to oxygen atoms in different states:

(Value obtained by summing up peak areas of $Q^1$, $Q^2$, and $Q^3$)/(Peak area of $Q^4$)<1.0    (I)

wherein $Q^1$ represents a silicon atom having bound to one neutral oxygen atom and three hydroxyl groups, $Q^2$ represents a silicon atom having bound to two neutral oxygen atoms and two hydroxyl groups, $Q^3$ represents a silicon atom having bound to three neutral oxygen atoms and one hydroxyl groups, and $Q^4$ represents a silicon atom having bound to four neutral oxygen atoms.

3. The laminate film according to claim 1, wherein a position in which a value of atomic ratio of silicon is from 29 at % to 38 at % in the silicon distribution curve takes up 90% or more of region of the thin film layer in the film thickness direction.

4. The laminate film according to claim 1, wherein the carbon distribution curve has a plurality of extremal values, and the absolute value of a difference between a maximum value and a minimum value of the extremal value is 15% at or greater.

5. The laminate film according to claim 1, wherein the carbon distribution curve has three or more extremal values, and in the three consecutive extremal values in the carbon distribution curve, a distance between any of the extremal values adjacent to each other is 200 nm or less.

6. The laminate film according to claim 1, wherein the oxygen distribution curve has three or more extremal values, and in the three consecutive extremal values in the oxygen distribution curve, a distance between any of the extremal values adjacent to each other is 200 nm or less.

7. The laminate film according to claim 1, wherein the thin film layer further contains hydrogen atoms.

8. The laminate film according to claim 1, wherein a film thickness of the thin film layer is from 320 nm to 3,000 nm.

9. The laminate film according to claim 1, wherein the substrate is formed of at least one type of resin selected from the group consisting of a polyester-based resin and a polyolefin-based resin.

10. The laminate film according to claim 9, wherein the polyester-based resin is at least one type of resin selected from the group consisting of polyethylene terephthalate and polyethylene naphthalate.

11. An organic electroluminescence device comprising the laminate film according to claim 1.

12. A photoelectric conversion device comprising the laminate film according to claim 1.

13. A liquid crystal display comprising the laminate film according to claim 1.

* * * * *